(12) United States Patent
Nishimura et al.

(10) Patent No.: US 8,124,314 B2
(45) Date of Patent: Feb. 28, 2012

(54) RADIATION-SENSITIVE COMPOSITION

(75) Inventors: Yukio Nishimura, Tokyo (JP); Hiromu Miyata, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 12/752,151

(22) Filed: Apr. 1, 2010

(65) Prior Publication Data

US 2010/0221664 A1 Sep. 2, 2010

Related U.S. Application Data

(63) Continuation of application No. PCT/JP2008/067391, filed on Sep. 26, 2008.

(30) Foreign Application Priority Data

Oct. 1, 2007 (JP) ................................. 2007-257633
Oct. 12, 2007 (JP) ................................. 2007-266487

(51) Int. Cl.
*G03F 7/004* (2006.01)
(52) U.S. Cl. ...................... 430/270.1; 430/907; 430/910
(58) Field of Classification Search ............... 430/270.1, 430/907, 910
See application file for complete search history.

(56) References Cited

U.S. PATENT DOCUMENTS

| | | | |
|---|---|---|---|
| 5,744,537 A | 4/1998 | Brunsvold et al. | |
| 5,968,713 A | 10/1999 | Nozaki et al. | |
| 6,013,416 A | 1/2000 | Nozaki et al. | |
| 6,057,080 A | 5/2000 | Brunsvold et al. | |
| 6,200,725 B1 | 3/2001 | Takechi et al. | |
| 6,280,898 B1 | 8/2001 | Hasegawa et al. | |
| 6,303,266 B1 | 10/2001 | Okino et al. | |
| 6,388,101 B1 | 5/2002 | Hada et al. | |
| 6,673,518 B2 * | 1/2004 | Nishi et al. | 430/270.1 |
| 6,746,818 B2 * | 6/2004 | Kinsho et al. | 430/270.1 |
| 6,844,133 B2 * | 1/2005 | Nishi et al. | 430/270.1 |
| 7,368,220 B2 * | 5/2008 | Kanda et al. | 430/270.1 |
| 2001/0003640 A1 | 6/2001 | Takechi et al. | |
| 2001/0026901 A1 | 10/2001 | Maeda et al. | |
| 2002/0098441 A1 | 7/2002 | Okino et al. | |
| 2003/0008232 A1 | 1/2003 | Kinsho et al. | |
| 2003/0054289 A1 | 3/2003 | Nishi et al. | |
| 2003/0087183 A1 | 5/2003 | Nishi et al. | |
| 2003/0149225 A1 | 8/2003 | Okino et al. | |
| 2004/0043324 A1 | 3/2004 | Okino et al. | |
| 2006/0141400 A1 | 6/2006 | Hirayama et al. | |
| 2007/0134593 A1 | 6/2007 | Hirayama et al. | |
| 2007/0218403 A1 | 9/2007 | Maeda et al. | |
| 2007/0269734 A1 | 11/2007 | Kimura et al. | |
| 2008/0038661 A1 | 2/2008 | Chiba et al. | |
| 2009/0023878 A1 | 1/2009 | Maeda et al. | |
| 2010/0266953 A1 | 10/2010 | Chiba et al. | |

FOREIGN PATENT DOCUMENTS

| | | |
|---|---|---|
| EP | 0159428 | 10/1985 |
| EP | 0233056 | 8/1987 |
| EP | 0264650 | 4/1988 |
| JP | 59-093448 | 5/1984 |
| JP | 05-188598 | 7/1993 |
| JP | 06-012452 | 1/1994 |
| JP | 9-73173 | 3/1997 |
| JP | 2000-026446 | 1/2000 |
| JP | 2000-122294 | 4/2000 |
| JP | 2000-159758 | 6/2000 |
| JP | 2001-109154 | 4/2001 |
| JP | 2002-308866 | 10/2002 |
| JP | 2002-371114 | 12/2002 |
| JP | 2003-064134 | 3/2003 |
| JP | 2003-113174 | 4/2003 |
| JP | 2003-147023 | 5/2003 |
| JP | 2003-270787 | 9/2003 |
| JP | 2003270787 | * 9/2003 |
| JP | 2003-342323 | 12/2003 |
| JP | 2003-345025 | 12/2003 |
| JP | 2004-101642 | 4/2004 |
| JP | 2005-60638 | 3/2005 |
| JP | 2006-227632 | 8/2006 |
| JP | 2006-349940 | 12/2006 |
| WO | WO 2005/069076 | 7/2005 |
| WO | WO 2006/035790 | 4/2006 |

* cited by examiner

OTHER PUBLICATIONS

International Search Report for corresponding International Application No. PCT/JP2008/067391, Oct. 28, 2008.

*Primary Examiner* — John Chu
(74) *Attorney, Agent, or Firm* — Ditthavong Mori & Steiner, P.C.

(57) ABSTRACT

A radiation-sensitive composition includes (A) a first polymer which becomes alkali-soluble by the action of an acid and does not contain a fluorine atom, (B) a second polymer having a repeating unit (b1) shown by the following formula (1) and a fluorine-containing repeating unit (b2), and (C) a radiation-sensitive acid generator, the content of the second polymer (B) in the composition being 0.1 to 20 parts by mass relative to 100 parts by mass of the first polymer (A).

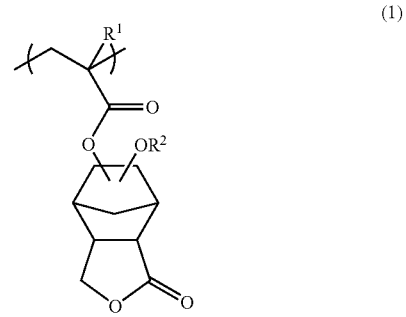

(1)

wherein $R^1$ represents a monovalent organic group, and $R^8$ represents a linear or branched alkyl group having 1 to 12 carbon atoms. The composition can form a resist film capable of suppressing defects inherent to liquid immersion lithography such as watermark defects and bubble defects.

3 Claims, No Drawings

RADIATION-SENSITIVE COMPOSITION

TECHNICAL FIELD

The present invention relates to a radiation-sensitive composition which is used for production of semiconductor devices such as ICs, liquid crystals, a circuit board such as a thermal head, and other photolithography processes. More particularly, the present invention relates to a radiation-sensitive composition suitable for use in a lithography process in which deep ultraviolet rays with a wavelength of 220 nm or less, such as ArF excimer laser light and electron beams, are used as an exposure light source.

BACKGROUND ART

A chemically amplified radiation-sensitive composition generates an acid when exposed to deep ultraviolet rays such as a KrF excimer laser and an ArF excimer laser, and produces a solubility rate difference between an exposed area and a non-exposed area in a developing solution by a chemical reaction catalyzed by the acid, thereby forming a resist pattern on a substrate.

For example, when a KrF excimer laser (wavelength: 248 nm) is used as a light source, it is possible to form an excellent pattern with high sensitivity and high resolution by using a chemically amplified radiation-sensitive composition containing a polymer having a polyhydroxystyrene (hereinafter referred to from time to time as "PHS") skeleton having a small absorbance of a light with a wavelength of 248 nm as a main component.

On the other hand, in order to form a more minute pattern, an ArF excimer laser (wavelength: 193 nm) is used as a light source having a shorter wavelength. A compound having an aromatic group such as PHS cannot be suitably used when an ArF excimer laser is used as a light source due to possession of a large absorbance at a wavelength of 193 nm which is the wavelength of an ArF excimer laser. Therefore, a radiation-sensitive composition containing a polymer having an alicyclic hydrocarbon skeleton which does not have a large absorbance at a wavelength of 193 nm has been used in a lithographic process using an ArF excimer laser.

Such a composition has been found to exhibit outstanding improvement in resolution performance as a resist if the polymer having an alicyclic hydrocarbon skeleton includes a repeating unit having a lactone skeleton.

For example, Patent Documents 1 and 2 describe a radiation-sensitive composition having a repeating unit with a mevalolactone skeleton or a γ-butyrolactone skeleton, and Patent Documents 3 to 13 describe a radiation-sensitive composition having a repeating unit with an alicyclic lactone skeleton.

Patent Document 1: Japanese Patent Application Publication (KOKAI) No. 9-73173
Patent Document 2: U.S. Pat. No. 6,388,101
Patent Document 3: Japanese Patent Application Publication (KOKAI) No. 2000-159758
Patent Document 4: Japanese Patent Application Publication (KOKAI) No. 2001-109154
Patent Document 5: Japanese Patent Application Publication (KOKAI) No. 2004-101642
Patent Document 6: Japanese Patent Application Publication (KOKAI) No. 2003-113174
Patent Document 7: Japanese Patent Application Publication (KOKAI) No. 2003-147023
Patent Document 8: Japanese Patent Application Publication (KOKAI) No. 2002-308866
Patent Document 9: Japanese Patent Application Publication (KOKAI) No. 2002-371114
Patent Document 10: Japanese Patent Application Publication (KOKAI) No. 2003-64134
Patent Document 11: Japanese Patent Application Publication (KOKAI) No. 2003-270787
Patent Document 12: Japanese Patent Application Publication (KOKAI) No. 2000-26446
Patent Document 13: Japanese Patent Application Publication (KOKAI) No. 2000-122294

DISCLOSURE OF THE INVENTION

However, radiation-sensitive compositions described in the above patent documents which merely exhibit improved resolution performance cannot satisfy various requirements for the resist composition which must cope with further miniaturization of a line width of 90 nm or less. In order to cope with further miniaturization in the future, development of a material suitably used in a liquid immersion lithography process which is presently being put into practice, for example, a material which can satisfy various requirements such as low line width roughness (hereinafter may be referred to from time to time as "LWR"), low defect-incurring properties, low PEB (post-exposure baking) temperature dependency, high pattern collapse resistance, and the like has been desired. Development of a material which can suppress watermark defects and bubble defects which are inherent to liquid immersion lithography is particularly desired in a liquid immersion lithography process.

Defect-incurring properties indicate properties of easily producing defects in a photolithography process. Defects in a photolithography process include a watermark defect, a blob defect, a bubble defect, and the like. When a large amount of such defects are produced in a device manufacturing process, the yield of the device is significantly affected.

The watermark defect indicates an immersion liquid drop scar on a resist pattern. The blob defect indicates a defect of a polymer blob attached to a substrate. Such a blob is produced by deposition of a polymer, which has once been dissolved in a developer due to a rinse shock, and reattachment to a substrate. The bubble defect indicates a defect caused by change of a light path due to entanglement of bubbles of immersion liquid during liquid immersion lithography, failing to obtain a desired pattern.

The present invention has been achieved in view of these problems in prior art technologies and has an object of providing a radiation-sensitive composition exhibiting not only excellent basic resist performance such as high resolution and low LWR, but also excellently suppressing defects inherent to liquid immersion lithography such as a watermark defect and bubble defect.

The inventors of the present invention have conducted extensive studies in order to achieve the above object. As a result, the inventors have found that the above object can be achieved by using a radiation-sensitive composition containing a first polymer which becomes alkali soluble by the action of an acid and does not contain a fluorine atom, and a second polymer which has a repeating unit shown by a specific formula and a fluorine-containing repeating unit. This finding has led to the completion of the present invention. According to the present invention, the following radiation-sensitive composition is provided.

The radiation-sensitive composition of the present invention includes (A) a first polymer which become alkali-soluble by the action of an acid and does not contain a fluorine atom and (B), and a second polymer having a repeating unit (b1)

shown by the following formula (1) and a fluorine-containing repeating unit (b2), and (C) a radiation-sensitive acid generator, the content of the second polymer (B) in the composition being 0.1 to 20 parts by mass relative to 100 parts by mass of the first polymer (A),

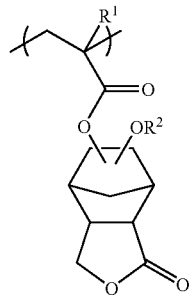

(1)

wherein $R^1$ represents a hydrogen atom, a methyl group, or a trifluoromethyl group, and $R^2$ represents a linear or branched alkyl group having 1 to 12 carbon atoms, a cycloalkyl group having 3 to 12 carbon atoms, an alkylcarbonyl group having 2 to 12 carbon atoms, or a hydroxyalkyl group having 1 to 12 carbon atoms.

The radiation-sensitive composition can be suitably used in a lithography process, preferably in a lithography process utilizing an ArF excimer laser as a light source. The composition of the present invention is particularly suitable for use as a chemically-amplified resist exhibiting excellent basic performance as a resist such as excellent resolution and low LWR, but also capable of suppressing watermark defects and bubble defects which are inherent to liquid immersion lithography.

In the radiation-sensitive composition of the present invention, the repeating unit (b2) having a fluorine atom in the second polymer (B) is preferably at least one of the repeating unit shown by the following formula (2) and the repeating unit shown by the following formula (3),

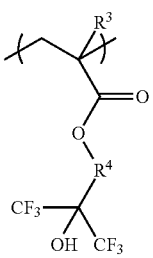

(2)

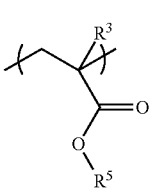

(3)

wherein $R^3$ represents a hydrogen atom, an alkyl group having 1 to 4 carbon atoms, a trifluoromethyl group, or a hydroxymethyl group, $R^4$ represents a divalent linear, branched, or cyclic hydrocarbon group, and $R^5$ represents a linear, branched, or cyclic alkyl group having 1 to 12 carbon atoms in which at least one hydrogen atom is substituted by a fluorine atom.

In the radiation-sensitive composition of the present invention, the radiation-sensitive acid generator (C) is preferably a compound shown by the following formula (4),

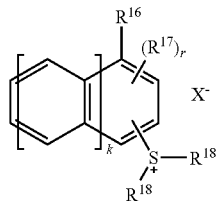

(4)

wherein $R^{16}$ represents a hydrogen atom, a fluorine atom, a hydroxyl group, a linear or branched alkyl group having 1 to 10 carbon atoms, a linear or branched alkoxy group having 1 to 10 carbon atoms, or a linear or branched alkoxycarbonyl group having 2 to 11 carbon atoms, $R^{17}$ represents a linear or branched alkyl group having 1 to 10 carbon atoms, a linear or branched alkoxy group having 1 to 10 carbon atoms, or a linear, branched, or cyclic alkanesulfonyl group having 2 to 11 carbon atoms, $R^{18}$ individually represent a linear or branched alkyl group having 1 to 10 carbon atoms, a substituted or unsubstituted phenyl group, or a substituted or unsubstituted naphthyl group, or bond to each other to form a substituted or unsubstituted divalent group having 2 to 10 carbon atoms, k represents an integer from 0 to 2, r represents an integer from 0 to 10, and $X^-$ represents an anion shown by one of the following formulas (5-1) to (5-4), provided that, when $X^-$ represents an anion shown by the following formula (5-1), $R^{18}$ do not bond to each other to form a substituted or unsubstituted divalent group having 2 to 10 carbon atoms.

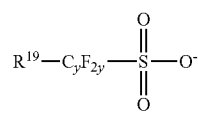

(5-1)

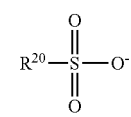

(5-2)

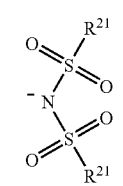

(5-3)

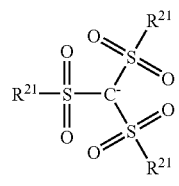

(5-4)

In the above formula (5-1), $R^{19}$ represents a hydrogen atom, a fluorine atom, or a substituted or unsubstituted hydrocarbon group having 1 to 12 carbon atoms, and y represents an integer from 1 to 10. $R^{20}$ in the above formula (5-2) represents a hydrocarbon group having 1 to 12 carbon atoms which is unsubstituted or substituted by an alkylcarbonyl group having 1 to 6 carbon atoms, an alkylcarbonyloxy group, or a hydroxyalkyl group. $R^{21}$ in the above formulas (5-3) and (5-4) individually represent a linear or branched fluoroalkyl group having 1 to 10 carbon atoms, or bond to each other to form a substituted or unsubstituted divalent fluorine-containing group having 2 to 10 carbon atoms.

A radiation-sensitive composition can be suitably used in a lithography process using an ArF excimer laser as a light source, and particularly exhibits not only excellent basic resist performance such as high resolution and low LWR, but also suppresses defects inherent to liquid immersion lithography such as a watermark defect and bubble defect.

BEST MODE FOR CARRYING OUT THE INVENTION

The present invention will be described by best embodiments, which should not be construed as limiting the present invention. It should be understood that various modifications and improvements may be made within the scope of the present invention based on knowledge of a person skilled in the art.

[1] Radiation-Sensitive Composition

The radiation-sensitive composition of the present invention includes (A) a first polymer which becomes alkali-soluble by the action of an acid and does not contain a fluorine atom, (B) a second polymer having a repeating unit (b1) shown by the following formula (1) and a fluorine-containing repeating unit (b2) including a fluorine atom, and (C) a radiation-sensitive acid generator, the content of the second polymer (B) in the composition being 0.1 to 20 parts by mass relative to 100 parts by mass of the first polymer (A). The content of the second polymer (B) for the first polymer (A) is calculated based on a solid content on a mass basis.

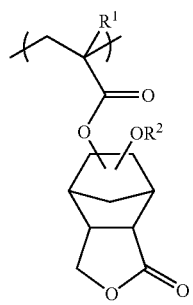

(1)

In the formula (1), $R^1$ represents a hydrogen atom, a methyl group, or a trifluoromethyl group, and $R^2$ represents a linear or branched alkyl group having 1 to 12 carbon atoms, a cycloalkyl group having 3 to 12 carbon atoms, an alkylcarbonyl group having 2 to 12 carbon atoms, or a hydroxyalkyl group having 1 to 12 carbon atoms.

A radiation-sensitive composition can be suitably used in a lithography process using an ArF excimer laser as a light source, and particularly exhibit not only excellent basic resist performance such as high resolution and low LWR, but also suppresses defects inherent to liquid immersion lithography such as a watermark defect and bubble defect.

In the radiation-sensitive composition of the present invention, the repeating unit (b2) having a fluorine atom in the second polymer (B) is preferably at least one repeating unit selected from the group consisting of a repeating unit shown by the following formula (2) and a repeating unit shown by the following formula (3), (2)

(3)

wherein $R^3$ represents a hydrogen atom, an alkyl group having 1 to 4 carbon atoms, a trifluoromethyl group, or a hydroxymethyl group, $R^4$ represents a divalent linear, branched, or cyclic hydrocarbon group, and $R^5$ represents a linear, branched, or cyclic alkyl group having 1 to 12 carbon atoms in which at least one hydrogen atom is substituted by a fluorine atom.

In addition to the first polymer (A), the second polymer (B), and the radiation-sensitive acid generator (C), the radiation-sensitive composition of the present invention may further include a nitrogen-containing compound (hereinafter referred to from time to time as "nitrogen-containing compound (D)"), an additive (E) (hereinafter referred to from time to time as "additive (E)"), and a solvent (hereinafter referred to from time to time as "solvent (F)").

Each component of the radiation-sensitive composition of the present invention will now be described.

[1-1] First Polymer (A)

The first polymer (A) contained in the radiation-sensitive composition of the present invention becomes alkali soluble by the action of an acid and does not contain a fluorine atom. The term "does not contain a fluorine atom" means that a fluorine atom is not intentionally included during the preparation of the first polymer (A).

As mentioned above, the first polymer (A) becomes soluble in alkali by the action of an acid. Specifically, the first polymer (A) includes a repeating unit which exhibits alkali-solubility by the action of an acid (hereinafter referred to from time to time as "repeating unit (a-1)"). A repeating unit included in a generally known radiation-sensitive composition can be used as the repeating unit (a-1) without particular limitation.

Although not particularly limited, the first polymer (A) preferably includes a repeating unit shown by the following formula (6) (hereinafter referred to as "repeating unit (6)") as the repeating unit (a1),

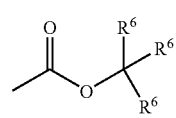

(6)

wherein $R^6$ individually represent a monovalent cycloalkyl group having 4 to 20 carbon atoms or its derivative, or a linear or branched alkyl group having 1 to 4 carbon atoms, at least one $R^6$ being a monovalent cycloalkyl group having 4 to 20 carbon atoms or its derivative or, any of two $R^6$ bonding to form a divalent cycloalkyl group having 4 to 20 carbon atoms together with the carbon atom (which bonds to the oxygen atom), with the remaining $R^6$ being a monovalent cycloalkyl group having 4 to 20 carbon atoms or its derivative.

Due to the possession of such a repeating unit (6), the first polymer (A) becomes soluble in alkali by the action of an acid.

As specific examples of the monovalent cycloalkyl group having 4 to 20 carbon atoms represented by $R^6$ and the divalent cycloalkyl group having 4 to 20 carbon atoms formed by two $R^6$ in the formula (6), groups having an alicyclic ring derived from a cycloalkane such as norbornane, tricyclodecane, tetracyclododecane, adamantane, cyclobutane, cyclopentane, cyclohexane, cycloheptane, and cyclooctane, groups in which the alicyclic ring is substituted by at least one linear, branched, or cyclic alkyl group having 1 to 4 carbon atoms such as a methyl group, an ethyl group, an n-propyl group, an i-propyl group, an n-butyl group, a 2-methylpropyl group, a 1-methylpropyl group, or a t-butyl group, and the like can be given. Of these, groups having an alicyclic ring derived from norbornane, tricyclodecane, tetracyclododecane, adamantane, cyclopentane, or cyclohexane, and a group in which such an alicyclic ring is substituted by any one of the above alkyl groups are preferable.

As specific examples of derivatives of the monovalent cycloalkyl groups having 4 to 20 carbon atoms groups represented by $R^6$ in the formula (6), groups having one or more substituents such as a hydroxyl group; a carboxyl group; an oxo group (=O), a hydroxyalkyl group having 1 to 4 carbon atoms such as a hydroxymethyl group, a 1-hydroxyethyl group, a 2-hydroxyethyl group, a 1-hydroxypropyl group, a 2-hydroxypropyl group, a 3-hydroxypropyl group, a 1-hydroxybutyl group, a 2-hydroxybutyl group, a 3-hydroxybutyl group, and a 4-hydroxybutyl group; an alkoxyl group having 1 to 4 carbon atoms such as a methoxy group, an ethoxy group, an n-propoxy group, an i-propoxy group, an n-butoxy group, a 2-methylpropoxy group, a 1-methylpropoxy group, and a t-butoxy group; a cyano group; a cyanoalkyl group having 2 to 5 carbon atoms such as a cyanomethyl group, a 2-cyanoethyl group, a 3-cyanopropyl group, and a 4-cyanobutyl group; and the like can be given. Of these, a hydroxyl group, carboxyl group, hydroxymethyl group, cyano group, cyanomethyl group, and the like are preferable.

As specific examples of the linear or branched alkyl group having 1 to 4 carbon atoms represented by $R^6$ in the formula (6), a methyl group, an ethyl group, an n-propyl group, an i-propyl group, an n-butyl group, a 2-methylpropyl group, a 1-methylpropyl group, a t-butyl group, and the like can be given. Of these, a methyl group, an ethyl group, an n-propyl group, and an i-propyl group are preferable.

As the group shown by the above formula (6) included in the repeating unit (6), the groups shown by the following formulas (6a) to (6d) are preferable.

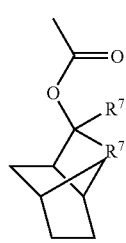

(6a)

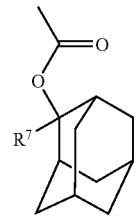

(6b)

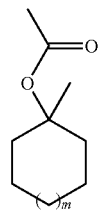

(6c)

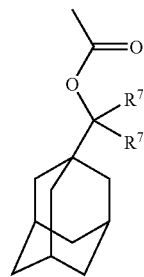

(6d)

wherein $R^7$ individually represent a linear or branched alkyl group having 1 to 4 carbon atoms, and m is an integer from 0 or 4.

As specific examples of the linear or branched alkyl group having 1 to 4 carbon atoms represented by $R^7$ in the formulas (6a) to (6d), a methyl group, an ethyl group, an n-propyl group, an i-propyl group, an n-butyl group, a 2-methylpropyl group, a 1-methylpropyl group, a t-butyl group, and the like can be given. Of these, a methyl group, an ethyl group, an n-propyl group, and an i-propyl group are preferable.

In the group shown by the formula (6a), a group in which two $R^7$ are a methyl group is particularly preferable. Among the groups shown by the formula (6b), groups having a methyl group, an ethyl group, an n-propyl group, or an i-propyl group for $R^7$ are preferable. Among the groups shown by the formula (6c), a group in which m is 0 and $R^7$ is a methyl group, a group in which m is 0 and $R^7$ is an ethyl group, a group in which m is 1 and $R^7$ is a methyl group, and a group in which m is 1 and $R^7$ is an ethyl group are preferable. In the group shown by the formula (6d), a group in which two $R^7$ are a methyl group is particularly preferable.

In addition to the groups shown by the above formulas (6a) to (6d), a t-butoxycarbonyl group and groups shown by the following formulas (6e-1) to (6e-8) can be given as the group shown by the above formula (6) included in the repeating unit (6).

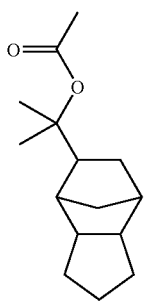

Although not particularly limited, the main chain skeleton of the repeating unit (6) is preferably a skeleton having a (meth)acrylate structure of an α-trifluoroacrylate structure. The term "(meth)acrylate" used herein refers to "acrylate" or "methacrylate".

As preferable examples of the monomer providing the repeating unit (6), 2-methyladamantyl-2-yl(meth)acrylate, 2-methyl-3-hydroxyadamantyl-2-yl(meth)acrylate, 2-ethyladamantyl-2-yl(meth)acrylate, 2-ethyl-3-hydroxyadamantyl-2-yl(meth)acrylate, 2-n-propyladamantyl-2-yl(meth)acrylate, 2-isopropyladamantyl-2-yl(meth)acrylate, 2-methylbicyclo[2.2.1]hept-2-yl(meth)acrylate, 2-ethylbicyclo[2.2.1]hept-2-yl(meth)acrylate, 8-methyltricyclo[5.2.1.0$^{2,6}$]decan-8-yl(meth)acrylate, 8-ethyltricyclo[5.2.1.0$^{2,6}$]decan-8-yl(meth)acrylate, 4-methyltetracyclo[6.2.1$^{3,6}$.0$^{2,7}$]dodecan-4-yl(meth)acrylate, 4-ethyltetracyclo[6.2.1$^{3,6}$.0$^{2,7}$]dodecan-4-yl(meth)acrylate, 1-(bicyclo[2.2.1]hept-2-yl)-1-methylethyl(meth)acrylate, 1-(tricyclo[5.2.1.0$^{2,6}$]decan-8-yl)-1-methylethyl(meth)acrylate, 1-(tetracyclo[6.2.1$^{3,6}$.0$^{2,7}$]dodecan-4-yl)-1-methylethyl(meth)acrylate, 1-(adamantan-1-yl)-1-methylethyl(meth)acrylate, 1-(3-hydroxyadamantan-1-yl)-1-methylethyl(meth)acrylate, 1,1-dicyclohexylethyl(meth)acrylate, 1,1-di(bicyclo[2.2.1]hept-2-yl)ethyl(meth)acrylate, 1,1-di(tricyclo[5.2.1.0$^{2,6}$]decan-8-yl)ethyl(meth)acrylate, 1,1-di(tetracyclo[6.2.1$^{3,6}$.0$^{2,7}$]dodecan-4-yl)ethyl(meth)acrylate, 1,1-di(adamantan-1-yl)ethyl(meth)acrylate, 1-methyl-1-cyclopentyl(meth)acrylate, 1-ethyl-1-cyclopentyl(meth)acrylate, 1-methyl-1-cyclohexyl(meth)acrylate, 1-ethyl-1-cyclohexyl(meth)acrylate, and the like can be given.

Of these monomers, 2-methyladamantyl-2-yl(meth)acrylate, 2-ethyladamantyl-2-yl(meth)acrylate, 2-methylbicyclo[2.2.1]hept-2-yl(meth)acrylate, 2-ethylbicyclo[2.2.1]hept-2-yl(meth)acrylate, 1-(bicyclo[2.2.1]hept-2-yl)-1-methlethyl(meth)acrylate, 1-(adamantan-1-yl)-1-methylethyl(meth)acrylate, 1-methyl-1-cyclopentyl(meth)acrylate, 1-ethyl-1-cyclopentyl(meth)acrylate, 1-methyl-1-cyclohexyl(meth)acrylate, 1-ethyl-1-cyclohexyl(meth)acrylate and the like are particularly preferable.

The first polymer (A) may have one or more types of the repeating units (6) described above.

In addition, the first polymer (A) may further include a repeating unit other than the repeating unit (6) (hereinafter referred to as "other recurring unit").

As examples of the "other repeating unit", a repeating unit shown by the following formulas (7-1) to (7-6) (hereinafter may be referred to from time to time as "repeating unit (7)"), a repeating unit shown by the following formula (8) (hereinafter may be referred to from time to time as "repeating unit (8)"), and a repeating unit shown by the following formula (9) (hereinafter may be referred to from time to time as "repeating unit (9)") can be given.

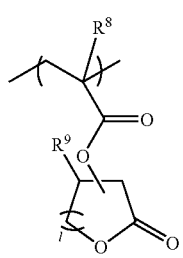
(7-1)

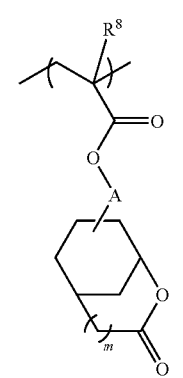
(7-2)

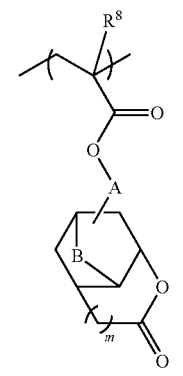
(7-3)

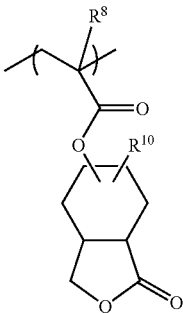
(7-4)

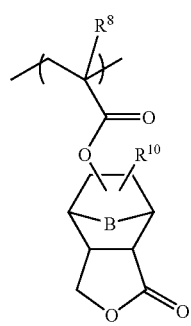
(7-5)

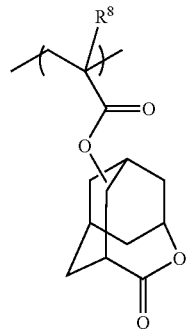
(7-6)

In the above formulas (7-1) to (7-6), $R^8$ represents a hydrogen atom, a methyl group, or a trifluoromethyl group, $R^9$ represents a hydrogen atom or a substituted or unsubstituted alkyl group having 1 to 4 carbon atoms, $R^{10}$ represents a hydrogen atom or a methoxy group, A represents a single bond or a methylene group, B represents an oxygen atom or a methylene group, l is an integer from 1 to 3, and m is 0 or 1.

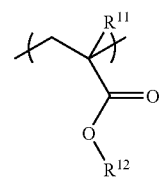
(8)

In the above formula (8), $R^{11}$ represents a hydrogen atom, a methyl group, or a trifluoromethyl group, and $R^{12}$ represents a polycyclic cycloalkyl group having 7 to 20 carbon atoms, which may be either unsubstituted or substituted by at least one substituent selected from the group consisting of an alkyl group having 1 to 4 carbon atoms, a hydroxyl group, a cyano group, and a hydroxyalkyl group having 1 to 10 carbon atoms.

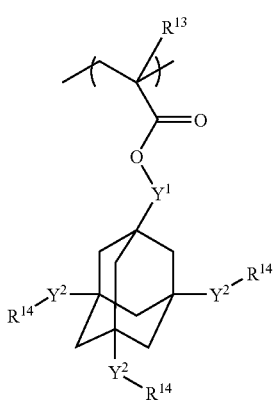
(9)

In the above formula (9), $R^{13}$ represents a hydrogen atom or a methyl group, $Y^1$ represents a single bond or a divalent organic group having 1 to 3 carbon atoms, $Y^2$ individually represent a single bond or a divalent organic group having 1 to 3 carbon atoms, and $R^{14}$ individually represent a hydrogen atom, a hydroxyl group, a cyano group, or a group $COOR^{15}$, wherein $R^{15}$ represents a hydrogen atom, a linear or branched alkyl group having 1 to 4 carbon atoms, or a cycloalkyl group having 3 to 20 carbon atoms.

In the above formula (9), it is preferable that at least one $R^{14}$ represent a group other than a hydrogen atom, and when $Y^1$ is a single bond, at least one $Y^2$ among three $Y^2$ represents a divalent organic group.

As examples of preferable monomers providing the repeating unit (6), 5-oxo-4-oxa-tricyclo[4.2.1.0$^{3,7}$]non-2-yl(meth)acrylate, 9-methoxycarbonyl-5-oxo-4-oxa-tricyclo[4.2.1.0$^{3,7}$]non-2-yl(meth)acrylate, 5-oxo-4-oxatricyclo[5.2.1.0$^{3,8}$]dec-2-yl(meth)acrylate, 10-methoxycarbonyl-5-oxo-4-oxa-tricyclo[5.2.1.0$^{3,8}$]non-2-yl(meth)acrylate, 6-oxo-7-oxa-bicyclo[3.2.1]oct-2-yl(meth)acrylate, 4-methoxycarbonyl-6-oxo-7-oxa-bicyclo[3.2.1]oct-2-yl(meth)acrylate, 7-oxo-8-oxa-bicyclo[3.3.1]non-2-yl(meth)acrylate, 6-oxa-5-oxo[5.2.1.0$^{2,6}$]dec-2-yl(meth)acrylate, 3-methoxy-6-oxa-5-oxo[5.2.1.0$^{2,6}$]dec-2-yl(meth)acrylate, 6-oxa-5-oxo[4.3.0]non-2-yl(meth)acrylate, 3-methoxy-6-oxa-5-oxo[4.3.0]non-2-yl(meth)acrylate, 4-methoxycarbonyl-7-oxo-8-oxa-bicyclo[3.3.1]non-2-yl(meth)acrylate, 2-oxotetrahydropyran-4-yl(meth)acrylate, 4-methyl-2-oxotetrahydropyran-4-yl(meth)acrylate, 4-ethyl-2-oxotetrahydropyran-4-yl(meth)acrylate, 4-propyl-2-oxotetrahydropyran-4-yl(meth)acrylate, 2-oxotetrahydrofuran-4-yl(meth)acrylate, 5,5-dimethyl-2-oxotetrahydrofuran-4-yl(meth)acrylate, 3,3-dimethyl-2-oxotetrahydrofuran-4-yl(meth)acrylate, 2-oxotetrahydrofuran-3-yl(meth)acrylate, 4,4-dimethyl-2-oxotetrahydrofuran-3-yl(meth)acrylate, 5,5-dimethyl-2-oxotetrahydrofuran-3-yl(meth)acrylate, methyl 5-oxotetrahydrofuran-2-yl(meth)acrylate, methyl 3,3-dimethyl-5-oxotetrahydrofuran-2-yl(meth)acrylate, and methyl 4,4-dimethyl-5-oxotetrahydrofuran-2-yl(meth)acrylate can be given.

$R^{12}$ in the other repeating unit (8) shown by the above formula (8) represents a polycyclic cycloalkyl group having 7 to 20 carbon atoms, i.e. a cycloalkyl group having a structure with two or more rings, such as bicyclo[2.2.1]heptane, bicyclo[2.2.2]octane, tricyclo[5.2.1.0$^{2,6}$]decane, tetracyclo[6.2.1.1$^{3,6}$.0$^{2,7}$]dodecane, and tricyclo[3.3.1.1$^{3,7}$]decane.

These polycyclic cycloalkyl groups may be substituted by, for example, one or more linear, branched, or cyclic alkyl groups having 1 to 4 carbon atoms such as a methyl group, an ethyl group, an n-propyl group, an i-propyl group, an n-butyl group, a 2-methylpropyl group, a 1-methylpropyl group, and a t-butyl group. The substituents are not limited to the above alkyl groups, but may include a hydroxyl group, a cyano group, a hydroxyalkyl group having 1 to 10 carbon atoms, a carboxyl group, and oxygen. The first polymer (A) may contain one or more types of these other repeating units (8).

As examples of preferable monomers providing the other repeating unit (8), bicyclo[2.2.1]heptyl(meth)acrylate, cyclohexyl(meth)acrylate, bicyclo[4.4.0]decanyl(meth)acrylate, bicyclo[2.2.2]octyl(meth)acrylate, tricyclo[5.2.1.0$^{2,6}$]decanyl(meth)acrylate, tetracyclo[6.2.1.1$^{3,6}$.0$^{2,7}$]dodecanyl(meth)acrylate, and tricyclo[3.3.1.1$^{3,7}$]decanyl(meth)acrylate can be given.

In the other repeating unit (9) shown by the above formula (9), $Y^1$ represents a single bond or a divalent organic group having 1 to 3 carbon atoms, and $Y^2$ individually represent a single bond or a divalent organic group having 1 to 3 carbon atoms. Examples of the divalent organic group having 1 to 3 carbon atoms represented by $Y^1$ and $Y^2$ include a methylene group, an ethylene group, and a propylene group.

$R^{15}$ in the group —$COOR^{15}$ which represents $R^{14}$ in the other repeating unit (9) shown by the above formula (9) indicates a hydrogen atom, a linear or branched alkyl group having 1 to 4 carbon atoms, or a cycloalkyl group having 3 to 20 carbon atoms. As examples of a linear or branched alkyl group having 1 to 4 carbon atoms represented by $R^{15}$, a methyl group, an ethyl group, an n-propyl group, an i-propyl group, an n-butyl group, a 2-methylpropyl group, a 1-methylpropyl group, and a t-butyl group can be given.

As examples of a cycloalkyl group having 3 to 20 carbon atoms represented by $R^{15}$, a monocyclic alkyl group represented by —$C_jH_{2j+1}$ (wherein j is an integer from 3 to 20) such as a cyclopropyl group, a cyclobutyl group, a cyclopentyl group, a cyclohexyl group, a cycloheptyl group, and a cyclooctyl group; a polycyclic alkyl group such as a bicyclo[2.2.1]heptyl group, a tricyclo[5.2.1.0$^{2,6}$]decyl group, a tetracyclo[6.2.1.1$^{3,6}$.0$^{2,7}$]dodecanyl group, and an adamantyl group; a group in which one or more hydrogen atoms in these groups are substituted by an alkyl group or a cycloalkyl group; and the like can be given.

As examples of preferable monomers providing the other repeating unit (9), 3-hydroxyadamant-1-yl(meth)acrylate, 3,5-dihydroxyadamant-yl(meth)acrylate, methyl 3-hydroxyadamant-1yl(meth)acrylate, methyl 3,5-dihydroxyadamant-1-yl(meth)acrylate, 3-hydroxy-5-methyladamant-yl(meth)acrylate, 3,5-dihydroxy-7-methyladamant-1-yl(meth)acrylate, 3-hydroxy-5,7-dimethyladamant-1-yl(meth)acrylate, and methyl 3-hydroxy-5,7-dimethyladamant-1-yl(meth)acrylate can be given.

The first polymer (A) included in the radiation-sensitive composition of the present invention may further include a repeating unit other than the repeating units (6) shown by the above formulas (6), the repeating units (7) to (9) shown by the above formula (9), and the other repeating units (7) to (9) shown by the above formula (9) (hereinafter referred to as "still other repeating unit").

Examples of such a still other repeating unit include units obtainable by cleavage of a polymerizable unsaturated bond of a polyfunctional monomer such as (meth)acrylates having a bridged hydrocarbon skeleton such as dicyclopentenyl (meth)acrylate and methyl adamantyl(meth)acrylate; carboxyl group-containing esters having a bridged hydrocarbon skeleton of an unsaturated carboxylic acid such as carboxynorbornyl(meth)acrylate, carboxytricyclodecanyl(meth)acrylate, and carboxytetracycloundecanyl(meth)acrylate;

(meth)acrylates not having a bridged hydrocarbon skeleton such as methyl(meth)acrylate, ethyl(meth)acrylate, n-propyl(meth)acrylate, n-butyl(meth)acrylate, 2-methylpropyl (meth)acrylate, 1-methylpropyl(meth)acrylate, t-butyl (meth)acrylate, 2-hydroxyethyl(meth)acrylate, 2-hydroxypropyl(meth)acrylate, 3-hydroxypropyl(meth)acrylate, cyclopropyl(meth)acrylate, cyclopentyl(meth)acrylate, cyclohexyl(meth)acrylate, 4-methoxycyclohexyl (meth)acrylate, 2-cyclopentyloxycarbonylethyl(meth)acrylate, 2-cyclohexyloxycarbonylethyl(meth)acrylate, and 2-(4-methoxycyclohexyl)oxycarbonylethyl(meth)acrylate;

α-hydroxymethylacrylates such as methyl α-hydroxymethylacrylate, ethyl α-hydroxymethylacrylate, n-propyl α-hydroxymethylacrylate, and n-butyl α-hydroxymethylacrylate; unsaturated nitrile compounds such as (meth)

acrylonitrile, α-chloroacrylonitrile, crotonitrile, maleinitrile, fumaronitrile, mesaconitrile, citraconitrile, and itaconitrile;

unsaturated amide compounds such as (meth)acrylamide, N,N-dimethyl(meth)acrylamide, crotonamide, maleinamide, fumaramide, mesaconamide, citraconamide, and itaconamide; nitrogen-containing vinyl compounds such as N-(meth)acryloylmorpholine, N-vinyl-ε-caprolactam, N-vinylpyrrolidone, vinylpyridine, and vinylimidazole;

unsaturated carboxylic acids (anhydrides) such as (meth)acrylic acid, crotonic acid, maleic acid, maleic anhydride, fumaric acid, itaconic acid, itaconic anhydride, citraconic acid, citraconic anhydride, and mesaconic acid;

carboxyl group-containing esters not having a bridged hydrocarbon skeleton of an unsaturated carboxylic acid such as 2-carboxyethyl(meth)acrylate, 2-carboxypropyl(meth)acrylate, 3-carboxypropyl(meth)acrylate, 4-carboxybutyl(meth)acrylate, and 4-carboxycyclohexyl(meth)acrylate;

polyfunctional monomers having a bridged hydrocarbon skeleton such as 1,2-adamantanediol di(meth)acrylate, 1,3-adamantanediol di(meth)acrylate, 1,4-adamantanediol di(meth)acrylate, and tricyclodecanyl dimethylol di(meth)acrylate; and polyfunctional monomers not having a bridged hydrocarbon skeleton such as methylene glycol di(meth)acrylate, ethylene glycol di(meth)acrylate, propylene glycol di(meth)acrylate, 1,6-hexanediol di(meth)acrylate, 2,5-dimethyl-2,5-hexanediol di(meth)acrylate, 1,8-octanediol di(meth)acrylate, 1,9-nonanediol di(meth)acrylate, 1,4-bis(2-hydroxypropyl)benzene di(meth)acrylate, and 1,3-bis(2-hydroxypropyl)benzene di(meth)acrylate.

The content of the repeating unit (6) in the first polymer (A) is preferably 10 to 90 mol %, more preferably 20 to 80 mol %, and particularly preferably 30 to 70 mol % of the total amount of repeating units forming the first polymer (A).

This content of the repeating unit (2) can improve developability, and decrease defects, LWR, and PEB temperature dependency as a resist. If the amount of the repeating unit (6) is less than 10 mol %, developability as a resist may be impaired, and LWR and PEB temperature dependency may increase; and if it is more than 90 mol %, developability may be impaired and defects may increase.

The other repeating units (7) to (9) and the still other repeating unit are optional components. The content of the other repeating unit (7), for example, is preferably 10 to 70 mol %, more preferably 15 to 65 mol %, and particularly preferably 20 to 60 mol % the total amount of repeating units.

This content of the repeating unit (7) can improve developability as a resist. If the content of the repeating unit (7) is less than 10 mol %, developability as a resist may be impaired. If it is more than 70 mol %, solubility in a solvent may decrease and resolution may be impaired.

The content of the repeating unit (8) is preferably 30 mol % or less, and more preferably 25 mol % or less of the total amount of repeating units. If the content of the repeating unit (8) is more than 30 mol %, the resist film produced tends to become swollen in an alkali developer and developability as a resist may decrease.

The content of the other repeating unit (9) is preferably 30 mol % or less, and more preferably 25 mol % or less of the total amount of repeating units. If the content of the repeating unit (9) is more than 30 mol %, the resist film produced tends to become swollen in an alkali developer and developability as a resist may decrease.

The content of the still other repeating unit is preferably 50 mol % or less, and more preferably 40 mol % or less of the total amount of repeating units.

Since the first polymer (A) is a polymer not containing a fluorine atom, any repeating units described above do not contain a fluorine atom.

Next, a method for producing the first polymer (A) will be described.

Although the first polymer (A) may be synthesized by a general method such as radical polymerization, it is preferable to employ a method of polymerizing a monomer by dropping a solution containing the monomer and a radical initiator into a solution containing a reaction solvent or the monomer, a method of polymerizing a monomer by dropping a solution containing the monomer and a solution containing a radical initiator separately into a solution containing a reaction solvent or the monomer, a method of polymerizing two or more types of monomers by dropping two or more solutions each containing a different type of monomer and a solution containing a radical initiator into a solution containing a reaction solvent or the monomer; and the like.

The reaction temperature in the above methods is appropriately determined according to the type of initiator used for the reaction, usually at 30 to 180° C., preferably 40 to 160° C., and more preferably 50 to 140° C.

The period of dropping (dropping time) varies according to the reaction temperature, the type of initiator, and the type of monomer, but is preferably 30 minutes to 8 hours, more preferably 45 minutes to 6 hours, and particularly preferably 1 to 5 hours. The total reaction time including the dropping time can be determined in the same way as above, in a range preferably from 30 minutes to 8 hours, more preferably from 45 minutes to 7 hours, and particularly preferably from 1 to 6 hours. When dropping a monomer solution into another monomer solution, the amount of monomer in the former solution (monomer solution to be added) is preferably 30 mol % or more, more preferably 50 mol % or more, and particularly preferably 70 mol % or more of the total amount of the monomer used for polymerization.

As examples of a radical initiator used for the polymerization, 2,2'-azobis(4-methoxy-2,4-dimethylvaleronitrile), 2,2'-azobis(2-cyclopropylpropionitrile), 2,2'-azobis(2,4-dimethylvaleronitrile), 2,2'-azobisisobutylonitrile, 2,2'-azobis(2-methylbutyronitrile), 1,1'-azobis(cyclohexane-1-carbonitrile), 2,2'-azobis(2-methyl-N-phenylpropioneamidine)dihydrochloride, 2,2'-azobis(2-methyl-N-2-propenylpropioneamidine)dihydrochloride, 2,2'-azobis[2-(5-methyl-2-imidazolin-2-yl)propane]dihydrochloride, 2,2'-azobis{2-methyl-N-[1,1-bis(hydroxymethyl)-2-hydroxyethyl]propioneamide}, dimethyl-2,2'-azobis(2-methylpropionate), 4,4'-azobis(4-cyanovaleric acid), and 2,2'-azobis[2-(hydroxymethyl)propionitrile] can be given. Either one of these initiators may be used independently or a mixture of two or more initiators may be used.

Any solvent which can dissolve the monomer and does not hinder the polymerization can be used as a polymerization solvent. As a solvent which hinders the polymerization, a solvent which prevents polymerization such as nitrobenzenes, a solvent having a chain transfer effect such as a mercapto compound, and the like can be given.

As examples of suitably used solvents, alcohols, ethers, ketones, amides, esters, lactones, and nitriles, as well as mixtures of these solvents can be given.

As examples of an alcohol solvent, methanol, ethanol, propanol, isopropanol, butanol, ethylene glycol, propylene glycol, ethylene glycol monomethyl ether, ethylene glycol monoethyl ether, and 1-methoxy-2-propanol can be given.

Examples of an ether solvent include propyl ether, isopropyl ether, butyl methyl ether, tetrahydrofuran, 1,4-dioxane, 1,3-dioxolane, and 1,3-dioxane. As examples of a ketone solvent, acetone, methyl ethyl ketone, diethyl ketone, methyl isopropyl ketone, methyl isobutyl ketone, and the like can be given.

As examples of an amide solvent, N,N-dimethylformamide, N,N-dimethylacetamide, and the like can be given. As examples of ester and lactone solvents, ethyl acetate, methyl acetate, isobutyl acetate, γ-butyrolactone, and the like can be given. As examples of a nitrile solvent, acetonitrile, propionitrile, butyronitrile, and the like can be given. Either one of these solvents may be used independently or a mixture of two or more solvents may be used.

After the polymerization, the resulting polymer is preferably collected by re-precipitation. Specifically, after the polymerization, the reaction solution is poured into a re-precipitation solvent to collect the target polymer by re-precipitation. As examples of the re-precipitation solvent, alcohols, ethers, ketones, amides, esters, lactones, and nitriles, as well as mixtures of these solvents can be given.

As examples of an alcohol solvent, methanol, ethanol, propanol, isopropanol, butanol, ethylene glycol, propylene glycol, and 1-methoxy-2-propanol can be given. Examples of an ether solvent include propyl ether, isopropyl ether, butyl methyl ether, tetrahydrofuran, 1,4-dioxane, 1,3-dioxolane, and 1,3-dioxane. As examples of a ketone solvent, acetone, methyl ethyl ketone, diethyl ketone, methyl isopropyl ketone, methyl isobutyl ketone, and the like can be given.

As examples of an amide solvent, N,N-dimethylformamide, N,N-dimethylacetamide, and the like can be given. As examples of an ester or lactone solvent, ethyl acetate, methyl acetate, isobutyl acetate, γ-butyrolactone, and the like can be given. As examples of a nitrile solvent, acetonitrile, propionitrile, butyronitrile, and the like can be given.

Low-molecular-weight components derived from the monomers described above may be included in the first polymer (A). The content of such low-molecular-weight components is preferably 0.1 mass % or less, more preferably 0.07 mass % or less, and still more preferably 0.05 mass % or less of the total amount (100 mass %) of the first polymer (A).

If the content of the low-molecular-weight components is 0.1 mass % or less, it is possible to reduce the amount of the components eluted into water from the resist film prepared from the composition containing the first polymer (A) when the resin film is processed by liquid immersion lithography. In addition, it is possible to prevent generation of extraneous substances in the resist during storage, inhibit uneven resist application, and sufficiently suppress production of defects during pattern formation.

The low-molecular-weight components derived from the monomers in the present invention refer to components including monomers, dimers, trimers, and oligomers, having a polystyrene-reduced weight average molecular weight (hereinafter referred to from time to time as "Mw") determined by gel permeation chromatography (GPC) of 500 or less. The components having Mw of 500 or less can be removed by, for example, a chemical purification method such as washing with water or liquid-liquid extraction, or a combination of the chemical purification method and a physical purification method such as ultrafiltration or centrifugation.

The amount of the low-molecular-weight components can be determined by analysis of the first polymer (A) using high performance liquid chromatography (HPLC). The content of impurities such as halogens and metals in the first polymer (A) is preferably as small as possible. The smaller the content of impurities, the more improved can be the sensitivity, resolution, process stability, pattern shape, and the like of the resulting resist.

The polystyrene-reduced weight average molecular weight (Mw) of the first polymer (A) measured by gel permeation chromatography (GPC) is preferably from 1000 to 100,000, more preferably 1000 to 30,000, and particularly preferably 1000 to 20,000. If Mw of the first polymer (A) is less than 1000, heat resistance as a resist may be decreased. If Mw exceeds 100,000, developability as a resist may be decreased. The ratio of Mw to the polystyrene-reduced number average molecular weight (hereinafter called "Mn") (Mw/Mn) determined by GPC of the first polymer (A) is preferably 1.0 to 5.0, more preferably 1.0 to 3.0, and particularly preferably 1.0 to 2.0.

When the radiation-sensitive composition is prepared from the first polymers (A), either one type of first polymer (A) or a mixture of two or more types of first polymer (A) can be used.

[1-2] Second Polymer (B)

The second polymer (B) includes a repeating unit (b1) shown by the following formula (1) and a repeating unit (b2) having a fluorine atom.

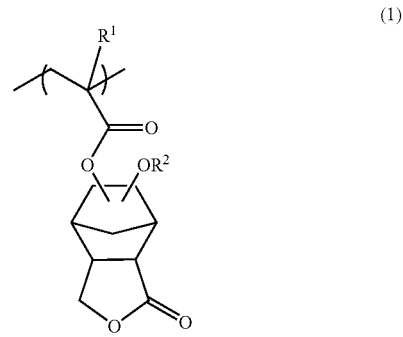

(1)

wherein $R^1$ represents a hydrogen atom, a methyl group, or a trifluoromethyl group, and $R^2$ represents a linear or branched alkyl group having 1 to 12 carbon atoms, a cycloalkyl group having 3 to 12 carbon atoms, an alkylcarbonyl group having 2 to 12 carbon atoms, or a hydroxyalkyl group having 1 to 12 carbon atoms.

The second polymer (B) has an effect of providing a resist film surface with water repellency. Thus, the second polymer (B) suppresses elution of components from the resist film to an immersion liquid and enables high speed scanning in liquid immersion lithography, consequently exhibiting an effect of controlling the defects originating from an immersion liquid such as a watermark defect.

There are no particular limitations to the second polymer (B) provided it includes a repeating unit (b1) shown by the following formula (1) and a repeating unit (b2) having a fluorine atom. However, the second polymer (B) is preferably a fluorine-containing polymer having any of the following characteristics (I) to (IV).

(I) A polymer which is not dissolved in a developer itself, but becomes soluble in alkali by the action of an acid.
(II) A polymer which is soluble in a developer itself and increases its solubility in alkali by the action of an acid.
(III) A polymer which is not dissolved in a developer itself, but becomes soluble in alkali by the action of an alkali.
(IV) A polymer which is soluble in a developer itself and increases its solubility in alkali by the action of an alkali.

As examples of the linear or branched alkyl group having 1 to 12 carbon atoms and the cycloalkyl group having 3 to 12 carbon atoms represented by $R^2$ in the above formula (1), a methyl group, an ethyl group, a propyl group, an i-propyl group, an i-butyl group, a t-butyl group, a cyclohexyl group, a cyclopentyl group, and a cycloheptyl group can be given.

As examples of the alkylcarbonyl group having 2 to 12 carbon atoms and the hydroxyalkyl group having 1 to 12 carbon atoms, a methylcarbonyl group, an ethylcarbonyl group, a propylcarbonyl group, a hydroxymethyl group, a hydroxyethyl group, and a hydroxypropyl group can be given.

In the radiation-sensitive composition of the present invention, a methyl group, an ethyl group, a methylcarbonyl group, an ethylcarbonyl group, a hydroxymethyl group, and a hydroxyethyl group can be given as preferable examples of $R^2$.

As preferable examples of monomers providing the repeating unit (b1), the monomers shown by the following formulas (1-1) to (1-6) can be given. In the following formulas (1-1) to (1-6), $R^1$ represents a hydrogen atom, a methyl group, or a trifluoromethyl group in the same way as in the above formula (1).

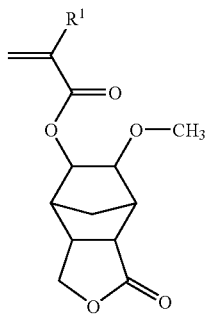

(1-1)

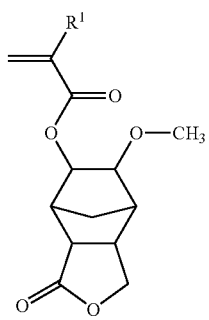

(1-2)

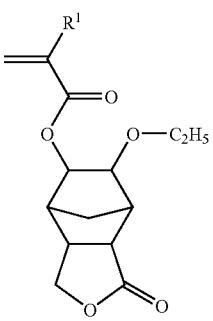

(1-3)

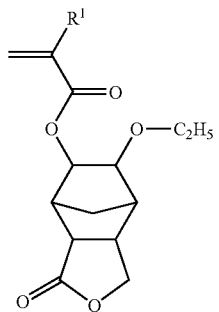

(1-4)

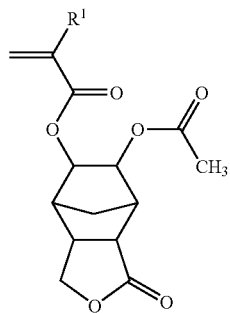

(1-5)

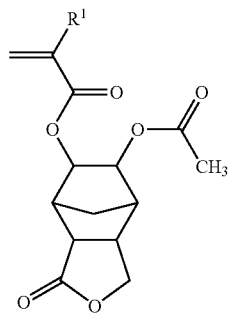

(1-6)

The second polymer (B) used in the radiation-sensitive composition of the present invention may contain two or more repeating units (b1) which are derived from the monomers given above as examples.

As the repeating unit (b2) having a fluorine atom, the second polymer (B) preferably include at least one of the repeating unit shown by the following formula (2) and the repeating unit shown by the following formula (3), The repeating unit shown by the following formula (2) is hereinafter referred to as "repeating unit (2)" and the repeating unit shown by the following formula (3) is hereinafter referred to as "repeating unit (3)".

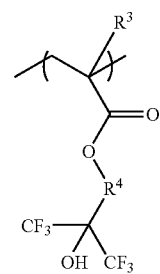

(2)

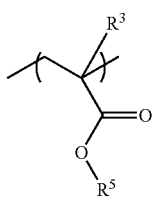

(3)

wherein R³ represents a hydrogen atom, an alkyl group having 1 to 4 carbon atoms, a trifluoromethyl group, or a hydroxymethyl group, R⁴ represents a divalent linear, branched, or cyclic hydrocarbon group, and R⁵ represents a linear, branched, or cyclic alkyl group having 1 to 12 carbon atoms in which at least one hydrogen atom is substituted by a fluorine atom.

R⁴ in the repeating unit (2) shown by the formula (2) is a divalent chain-like or cyclic hydrocarbon group, which may include an alkylene glycol group and an alkylene ester group. As preferable examples of R⁴, a saturated chain-like hydrocarbon group such as a methylene group, an ethylene group, a propylene group (e.g., 1,2-propylene group, 1,3-propylene group), a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, an icosylene group, a 1-methyl-1,3-propylene group, a 2-methyl-1,2-propylene group, a 1-methyl-1,4-butylene group, a 2-methyl-1,4-butylene group, a methylidene group, an ethylidene group, a propylidene group, and a 2-propylidene group;

bridged cyclic hydrocarbon groups such as a monocyclic hydrocarbon ring group such as a cycloalkylene group having 3 to 10 carbon atoms, for example, a cyclobutylene group such as a 1,3-cyclobutylene group, a cyclopentylene group such as a 1,3-cyclopentylene group, a cyclohexylene group such as a 1,4-cyclohexylene group, and a cyclooctylene group such as a 1,5-cyclooctylene group; a cyclic hydrocarbon group having 2 to 4 rings and 4 to 30 carbon atoms, for example, a norbornylene group such as a 1,4-norbornylene group and 2,5-norbornylene group, and an adamantylene group such as a 1,5-adamantylenegroup and a 2,6-adamantylene group can be given.

As examples of preferable monomers providing the other repeating unit (2), (1,1,1-trifluoro-2-trifluoromethyl-2-hydroxy-3-propyl)(meth)acrylate, (1,1,1-trifluoro-2-trifluoromethyl-2-hydroxy-4-butyl)(meth)acrylate, (1,1,1-trifluoro-2-trifluoromethyl-2-hydroxy-5-pentyl)(meth)acrylate, (1,1,1-trifluoro-2-trifluoromethyl-2-hydroxy-4-pentyl)(meth)acrylate, 2-{[5-(1',1',1'-trifluoro-2'-trifluoromethyl-2'-hydroxy)propyl]bicyclo[2.2.1]heptyl}-(meth)acrylate, 4-{[9-(1',1',1'-trifluoro-2'-trifluoromethyl-2'-hydroxy)propyl]tetracyclo[6.2.1.1³,⁶.0²,⁷]-dodecyl}(meth)acrylate, and the like can be given.

As examples of R⁵ in the formula (3), a trifluoromethyl group, a 2,2,2-trifluoroethyl group, a perfluoroethyl group, a perfluoro-n-propyl group, a perfluoro-i-propyl group, a perfluoro-n-butyl group, a perfluoro-i-butyl group, a perfluoro-t-butyl group, a perfluorocyclohexyl group, a 2-(1,1,1,3,3,3-hexafluoro)propyl group, a 2,2,3,3,4,4,5,5-octafluoropentyl group, a 2,2,3,3,4,4,5,5-octafluorohexyl group, a perfluorocyclohexylmethyl group, a 2,2,3,3,3-pentafluoropropyl group, a 2,2,3,3,4,4,4-heptafluoropentyl group, a 3,3,4,4,5,5,6,6,7,7,8,8,9,9,10,10,10-heptadecafluorodecyl group, a 3,3,4,4,5,6,6,6-octafluorohexyl group, and the like can be given.

As preferable examples of the fluorine-containing repeating unit, trifluoromethyl(meth)acrylate, 2,2,2-trifluoroethyl(meth)acrylate, perfluoro-ethyl(meth)acrylate, perfluoro-n-propyl(meth)acrylate, perfluoro-i-propyl(meth)acrylate, perfluoro-n-butyl(meth)acrylate, perfluoro-i-butyl(meth)acrylate, perfluoro-t-butyl(meth)acrylate, perfluorocyclohexyl(meth)acrylate, 2-(1,1,1,3,3,3-hexafluoro)propyl(meth)acrylate, 1-(2,2,3,3,4,4,5,5-octafluoro)pentyl(meth)acrylate, 1-(2,2,3,3,4,4,5,5-octafluoro)hexyl(meth)acrylate, perfluorocyclohexylmethyl(meth)acrylate, 1-(2,2,3,3,3-pentafluoro)propyl(meth)acrylate, 1-(2,2,3,3,4,4,4-heptafluoro)penta(meth)acrylate, 1-(3,3,4,4,5,5,6,6,7,7,8,8,9,9,10,10,10-heptadecafluoro)decyl(meth)acrylate, 1-(5-trifluoromethyl-3,3,4,4,5,6,6,6-octafluoro)hexyl(meth)acrylate, and the like can be given.

The second polymer (B) may further include at least one repeating unit among the repeating unit (6), the other repeating units (7) to (9), and the still other repeating unit which are described in the description of the first polymer (A).

The radiation-sensitive composition of the present invention contains 0.1 to 20 parts by mass of the second polymer (B) relative to 100 parts by mass of the first polymer (A) on a solid content basis. This content of the second polymer (B) ensures the radiation-sensitive composition to fully exhibit the effect of a fluorine-containing polymer (second polymer (B)). If the effect of a resist film surface to repel water in liquid immersion lithography decreases, it may cause elution of components from the resist film to an immersion liquid and a watermark defect due to remaining water drops when liquid immersion lithography is performed by high speed scanning If the content of the second polymer (B) is more than 20 parts by mass, a top loss of a resist pattern occurs, resulting in an impaired pattern shape.

The content of the second polymer (B) relative to 100 parts by mass of the first polymer (A) on a solid content basis is preferably 0.1 to 15 parts by mass, and more preferably 0.5 to 15 parts by mass.

The second polymer (B) can be prepared in the same manner as the first polymer (A) using the repeating unit (b1) shown by the formula (1) and the repeating unit (b2) having a fluorine atom which are described above.

[1-3] Radiation-Sensitive Acid Generator (C)

The radiation-sensitive acid generator (C) included in the radiation-sensitive composition of the present invention (hereinafter referred to from time to time simply as "acid generator (C)") is a component which generates an acid by exposure to radiation and functions as a photoacid generator. The acid generator causes the acid-dissociable group in the first polymer (A) which is contained in the radiation-sensitive composition to dissociate (by causing a protective group to dissociate) by the action of an acid generated upon exposure and causes the first polymer (A) to become alkali soluble. As a result, the exposed area on the resist film is rendered soluble in an alkaline developer to form a positive-tone resist pattern.

The acid generator (C) including a compound shown by the following formula (4) is preferably used in the present invention,

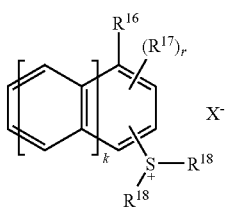

(4)

wherein $R^{16}$ represents a hydrogen atom, a fluorine atom, a hydroxyl group, a linear or branched alkyl group having 1 to 10 carbon atoms, a linear or branched alkoxy group having 1 to 10 carbon atoms, or a linear or branched alkoxycarbonyl group having 2 to 11 carbon atoms, $R^{17}$ represents a linear or branched alkyl group having 1 to 10 carbon atoms, a linear or branched alkoxy group having 1 to 10 carbon atoms, or a linear, branched, or cyclic alkanesulfonyl group having 2 to 11 carbon atoms, $R^{18}$ individually represent a linear or branched alkyl group having 1 to 10 carbon atoms, a substituted or unsubstituted phenyl group, or a substituted or unsubstituted naphthyl group, or bond to each other to form a substituted or unsubstituted divalent group having 2 to 10 carbon atoms, k represents an integer from 0 to 2, r represents an integer from 0 to 10, and $X^-$ represents an anion shown by one of the following formulas (5-1) to (5-4), provided that, when $X^-$ represents an anion shown by the following formula (5-1), $R^{18}$ do not bond to each other to form a substituted or unsubstituted divalent group having 2 to 10 carbon atoms.

(5-1)

(5-2)

(5-3)

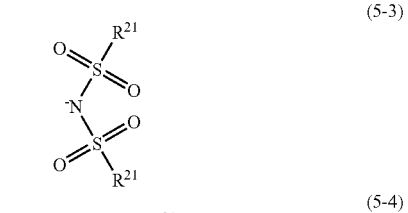

(5-4)

In the formula (4), as examples of the linear or the branched alkyl group having 1 to 10 carbon atoms represented by $R^{16}$, a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, and an n-decyl group can be given. Of these, a methyl group, an ethyl group, an n-butyl group, and a t-butyl group are preferable.

As examples of the linear or branched alkoxy group having 1 to 10 carbon atoms represented by $R^{16}$ in the formula (4), a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, and an n-decyloxy group can be given. Of these, a methoxy group, an ethoxy group, an n-propoxy group, an n-butoxy group, and the like are preferable.

As examples of the linear or branched alkoxycarbonyl group having 2 to 11 carbon atoms represented by $R^{16}$ in the formula (4), a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, and an n-decyloxycarbonyl group can be given. Among these, a methoxycarbonyl group, an ethoxycarbonyl group, and an n-butoxycarbonyl group are preferable.

As examples of the linear or branched alkyl group having 1 to 10 carbon atoms and the linear or branched alkoxy group having 1 to 10 carbon atoms represented by $R^{17}$ in the formula (4), the same groups as those previously given for the groups $R^{16}$ in the formula (4) can be given.

As specific examples of the linear, branched, or cyclic alkanesulfonyl group having 1 to 10 carbon atoms represented by $R^{17}$, a methanesulfonyl group, an ethanesulfonyl group, an n-propylsulfonyl group, an n-butylsulfonyl group, a tert-butylsulfonyl group, an n-pentylsulfonyl group, a neopentylsulfonyl group, an n-hexylsulfonyl group, an n-heptylsulfonyl group, an n-octylsulfonyl group, a 2-ethylhexane sulfonyl group, an n-nonylsulfonyl group, an n-decylsulfonyl group, a cyclopentanesulfonyl group, and a cyclohexanesulfonyl group can be given. Of these, a methanesulfonyl group, an ethanesulfonyl group, an n-propylsulfonyl group, an n-butylsulfonyl group, a cyclopentanesulfonyl group, and a cyclohexanesulfonyl group are preferable. r in the formula (4) is preferably 0 to 2.

As specific examples of the linear or branched alkyl group having 1 to 10 carbon atoms and the linear or branched alkoxy group having 1 to 10 carbon atoms represented by $R^{18}$ in the formula (4), the same groups as those previously given for the groups $R^{16}$ in the formula (4) can be given.

Examples of the substituted or unsubstituted phenyl group represented by $R^{18}$ in the formula (4) include a phenyl group; phenyl groups such as an o-tolyl group, an m-tolyl group, a p-tolyl group, a 2,3-dimethylphenyl group, a 2,4-dimethylphenyl group, a 2,5-dimethylphenyl group, a 2,6-dimethylphenyl group, a 3,4-dimethylphenyl group, a 3,5-dimethylphenyl group, a 2,4,6-trimethylphenyl group, a 4-ethylphenyl group, a 4-t-butylphenyl group, a 4-cyclohexylphenyl group, and a 4-fluorophenyl group; alkyl-substituted phenyl groups derived by substituting these phenyl groups with a linear, branched, or cyclic alkyl group having 1 to 10 carbon atoms; groups obtained by substituting the phenyl groups or the alkyl-substituted phenyl groups with one or more groups such as a hydroxyl group, a carboxyl group, a cyano group, a nitro group, an alkoxy group, an alkoxyalkyl group, an alkoxycarbonyl group, and an alkoxycarbonyloxy group; and the like. Among these, a phenyl group, a 4-cyclohexylphenyl group, a 4-t-butylphenyl group, a 4-methoxyphenyl group, and a 4-t-butoxyphenyl group are preferable.

Specific examples of the alkoxyalkyl group include linear, branched, or cyclic alkoxyalkyl groups having 2 to 21 carbon atoms such as a methoxymethyl group, an ethoxymethyl group, a 1-methoxyethyl group, a 2-methoxyethyl group, a 1-ethoxyethyl group, and a 2-ethoxyethyl group. Specific examples of the alkoxycarbonyl group include linear, branched, or cyclic alkoxycarbonyl groups having 2 to 21 carbon atoms such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group, and a cyclohexyloxycarbonyl group. As specific examples of the alkoxycarbonyloxy group, linear, branched, or cyclic alkoxycarbonyloxy groups having 2 to 21 carbon atoms such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyl group, and a cyclohexyloxycarbonyl group can be given.

As specific examples of the substituted or unsubstituted naphthyl group represented by $R^{18}$ in the formula (4), a naphthyl group such as a 1-naphthyl group, a 2-methyl-1-naphthyl group, a 3-methyl-1-naphthyl group, a 4-methyl-1-naphthyl group, a 5-methyl-1-naphthyl group, a 6-methyl-1-naphthyl group, a 7-methyl-1-naphthyl group, a 8-methyl-1-naphthyl group, a 2,3-dimethyl-1-naphthyl group, a 2,4-dimethyl-1-naphthyl group, a 2,5-dimethyl-1-naphthyl group, a 2,6-dimethyl-1-naphthyl group, a 2,7-dimethyl-1-naphthyl group, a 2,8-dimethyl-1-naphthyl group, a 3,4-dimethyl-1-naphthyl group, a 3,5-dimethyl-1-naphthyl group, a 3,6-dimethyl-1-naphthyl group, a 3,7-dimethyl-1-naphthyl group, a 3,8-dimethyl-1-naphthyl group, a 4,5-dimethyl-1-naphthyl group, a 5,8-dimethyl-1-naphthyl group, a 4-ethyl-1-naphthyl group, a 2-naphthyl group, a 1-methyl-2-naphthyl group, a 3-methyl-2-naphthyl group, and a 4-methyl-2-naphthyl group; and a naphthyl group derivative obtained by substituting a hydrogen atom in these naphthyl groups by a linear, branched, or cyclic alkyl group having 1 to 10 carbon atoms, as well as the groups obtained by further substituting one or more hydrogen atoms in the naphthyl group or alkyl-substituted naphthyl group by a hydroxyl group, a carboxyl group, a cyano group, a nitro group, an alkoxy group, an alkoxyalkyl group, an alkoxycarbonyl group, or an alkoxycarbonyloxy group can be given. Among these, a 1-naphthyl group, a 1-(4-methoxynaphthyl) group, a 1-(4-ethoxynaphthyl) group, a 1-(4-n-propoxynaphthyl) group, a 1-(4-n-butoxynaphthyl) group, a 2-(7-methoxynaphthyl) group, a 2-(7-ethoxynaphthyl) group, a 2-(7-n-propoxynaphthyl) group, and a 2-(7-n-butoxynaphthyl) group are preferable.

As specific examples of the alkoxyalkyl group, the alkoxycarbonyl group, and the alkoxycarbonyloxy group as the substituent for the naphthyl group and the alkyl-substituted naphthyl group, those mentioned as the alkoxyalkyl group, the alkoxycarbonyl group, and the alkoxycarbonyloxy group to be substituted with a phenyl group and an alkyl-substituted phenyl group can be given.

The substituted or unsubstituted divalent group having 2 to 10 carbon atoms formed by bonding of two $R^{18}$ in the formula (4) is preferably those forming a 5-membered ring or 6-membered ring divalent group together with the sulfur atom in the formula (4), particularly a 5-membered ring divalent group (i.e. tetrahydrothiophene ring). As specific examples of the substituent for the divalent group, the groups mentioned above as substituents for the phenyl group and the substituted phenyl group can be given.

As specific examples of preferable cation moieties of the formula (4), a triphenylsulfonium cation, tri-1-naphthylsulfonium cation, a tri-tert-butylphenylsulfonium cation, a 4-fluorophenyldiphenylsulfonium cation, a di-4-fluorophenylphenylsulfonium cation, a tri-4-fluorophenylsulfonium cation, a 4-cyclohexylphenyldiphenylsulfonium cation, a 4-methanesulfonylphenyldiphenylsulfonium cation, a 4-cyclohexanesulfonyldiphenylsulfonium cation, a 1-naphthyldimethylsulfonium cation, 1-naphthyldiethyl sulfonium cation, a 1-(4-hydroxynaphthalen-1-yl)dimethylsulfonium cation, a 1-(4-methylnaphthalen-1-yl)dimethylsulfonium cation, a 1-(4-methylnaphthalen-1-yl)diethylsulfonium cation, a 1-(4-cyanonaphthalen-1-yl)dimethylsulfonium cation, a 1-(4-cyanonaphthalen-1-yl)diethylsulfonium cation, a 1-(3,5-dimethyl-4-hydroxyphenyl)tetrahydrothiophenium cation, a 1-(4-methoxynaphthalen-1-yl)tetrahydrothiophenium cation, a 1-(4-ethoxynaphthalen-1-yl)tetrahydrothiophenium cation, a 1-(4-n-propoxynaphthalen-1-yl)tetrahydrothiophenium cation, a 1-(4-n-butoxynaphthalen-1-yl)tetrahydrothiophenium cation, a 2-(7-methoxynaphthalen-2-yl)tetrahydrothiophenium cation, a 2-(7-ethoxynaphthalen-2-yl)tetrahydrothiophenium cation, a 2-(7-n-propoxynaphthalen-2-yl)tetrahydrothiophenium cation, and a 2-(7-n-butoxynaphthalen-2-yl)tetrahydrothiophenium cation can be given.

In the above formula (5-1), $R^{19}$ represents a hydrogen atom, a fluorine atom, or a substituted or unsubstituted hydrocarbon group having 1 to 12 carbon atoms, and y represents an integer from 1 to 10. In the above formula (5-2), $R^{20}$ represents a hydrocarbon group having 1 to 12 carbon atoms which is unsubstituted or substituted by an alkylcarbonyl group having 1 to 6 carbon atoms, an alkylcarbonyloxy group, or a hydroxyalkyl group. Further, in the above formulas (5-3) and (5-4), $R^{21}$ individually represent a linear or branched fluoroalkyl group having 1 to 10 carbon atoms or two $R^{22}$ bond to each other to form a substituted or unsubstituted divalent fluorine-containing group having 2 to 20 carbon atoms.

$C_yF_{2y+1}^-$ in the formula (5-1) represents a linear or branched perfluoroalkylene group having y carbon atoms, wherein y is preferably an integer of 1, 2, 4, or 8. As the hydrocarbon group having 1 to 12 carbon atoms represented by $R^{19}$ in the formula (5-1), an alkyl group, a cycloalkyl group, and a bridged alicyclic hydrocarbon group having 12 or less carbon atoms can be given. As specific examples, a methyl group, an ethyl group, an n-propyl group, an i-propyl group, an n-butyl group, a 2-methylpropyl group, a 1-methylpropyl group, a t-butyl group, an n-pentyl group, an neopentyl group, an n-hexyl group, a cyclohexyl group, an n-heptyl group, an n-octyl group, a 2-ethylhexyl group, an n-nonyl group, an n-decyl group, a norbornyl group, a norbornylmethyl group, a hydroxynorbornyl group, an adamantyl group, and the like can be given.

As specific examples of the linear or branched fluoroalkyl group having 1 to 10 carbon atoms represented by $R^{21}$ in the above formulas (5-3) and (5-4), a trifluoromethyl group, a pentafluoroethyl group, a heptafluoropropyl group, a nonafluorobutyl group, a dodecafluoropentyl group, a perfluorooctyl group, and the like can be given.

As specific examples of the substituted or unsubstituted divalent fluorine-containing group having 2 to 10 carbon atoms formed by bonding of two $R^{21}$ in the formulas (5-3) and (5-4), a tetrafluoroethylene group, a hexafluoropropylene group, an octafluorobutylene group, a decafluoropentylene group, an undecafluorohexylene group, and the like can be given.

That is, specific examples of the anion moiety in the formula (4) include a trifluoromethanesulfonate anion, a perfluoro-n-butylsulfonate anion, a perfluoro-n-octylsulfonate anion, a 2-bicyclo[2.2.1]hept-2-yl-1,1,2,2-tetrafluoroethylsulfonate anion, a 2-bicyclo[2.2.1]hept-2-yl-1,1-difluoroethylsulfonate anion, a 1-adamantylsulfonate anion, the anions shown by the following formulas (10-1) to (10-7), and the like.

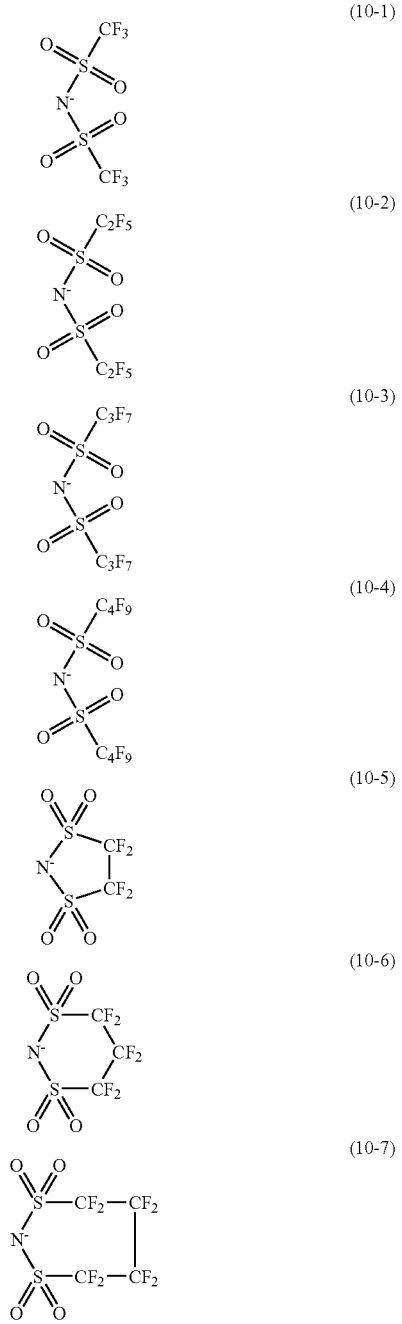

There are various radiation-sensitive acid generators shown by the formula (4) according to the combination of the cations and anions mentioned above. The combination is not particularly limited. The radiation-sensitive composition may include one type of the radiation-sensitive acid generator or may include two or more types of the radiation-sensitive acid generator.

However, a combination of a cation having a substituted or unsubstituted divalent group having 2 to 10 carbon atoms formed by bonding of two $R^{18}$ groups such as a 1-(3,5-dimethyl-4-hydroxyphenyl)tetrahydrothiophenium cation, a 1-(4-methoxynaphthalen-1-yl)tetrahydrothiophenium cation, a 1-(4-ethoxynaphthalen-1-yl)tetrahydrothiophenium cation, a 1-(4-n-propoxynaphthalen-1-yl)tetrahydrothiophenium cation, a 1-(4-n-butoxynaphthalen-1-yl)tetrahydrothiophenium cation, a 2-(7-methoxynaphthalen-2-yl)tetrahydrothiophenium cation, a 2-(7-ethoxynaphthalen-2-yl)tetrahydrothiophenium cation, a 2-(7-n-propoxynaphthalen-2-yl)tetrahydrothiophenium cation, and a 2-(7-n-butoxynaphthalen-2-yl)tetrahydrothiophenium cation, and an anion shown by the formula (5-1) such as a trifluoromethanesulfonate anion, a perfluoro-n-butanesulfonate anion, and a perfluoro-n-octanesulfonate anion is excluded from the combination that may be used for the radiation-sensitive acid generator.

The amount of the acid generator (C) to be used is preferably 0.1 to 20 parts by mass, more preferably 0.5 to 15 parts by mass, and particularly preferably 0.5 to 10 parts by mass relative to 100 parts by mass of the first polymer (A) from the viewpoint of ensuring sensitivity and developability as a resist. If the amount is less than 0.1 part by mass, sensitivity and developability may be impaired. If this amount is more than 20 parts by mass, transparency of the resist to radiation tends to decrease, which makes it difficult to obtain a rectangular resist pattern.

The radiation-sensitive composition may further contain a radiation-sensitive acid generator (hereinafter referred to as "other radiation-sensitive acid generator") other than the radiation-sensitive acid generator containing the compound shown by the formula (4).

The amount of the other radiation-sensitive acid generator to be added is preferably 80 mass % or less, more preferably 60 mass % or less, and particularly preferably 50 mass % or less of the total amount of radiation-sensitive acid generators used. Although there is no lower limit to the amount of the other radiation-sensitive acid generator, an amount of 5 mass % or more is added when such other radiation-sensitive acid generator is required.

Examples of the other radiation-sensitive acid generator include an onium salt compound, a halogen-containing compound, a diazoketone compound, a sulfone compound, a sulfonic acid compound, and the like. The radiation-sensitive composition may include one type of the radiation-sensitive acid generator or may include two or more types of the radiation-sensitive acid generator.

Examples of onium salt compounds include an iodonium salt, a sulfonium salt, a phosphonium salt, a diazonium salt, a pyridinium salt, and the like. As specific examples of an onium salt compound, diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, cyclohexyl.2-oxocyclohexyl.methylsulfonium trifluoromethanesulfonate, dicyclohexyl.2-oxocyclohexylsulfonium trifluoromethanesulfonate, 2-oxocyclohexyldimethylsulfonium trifluoromethanesulfonate, 1-(3,5-dimethyl-4-hydroxyphenyetetrahydrothiophenium trifluoromethanesulfonate, 1-(3,5-dimethyl-4-hydroxyphenyetetrahydrothiophenium perfluoro-n-butylsulfonate, 1-(3,5-dimethyl-4-hydroxyphenyl)tetrahydrothiophenium perfluoro-n-octylsulfonate, 1-(4-methoxynaphthalen-1-yl)tetrahydrothiophenium trifluoromethanesulfonate, 1-(4-methoxynaphthalen-1-yl)tetrahydrothiophenium perfluoro-n-butylsulfonate, 1-(4-methoxynaphthalen-1-yl)tetrahydrothiophenium perfluoro-n-octylsulfonate, 1-(4-ethoxynaphthalen-1-yl)tetrahydrothiophenium trifluoromethane sulfonate, 1-(4-ethoxynaphthalen-1-yl)tetrahydro thiophenium perfluoro-n-butylsulfonate, 1-(4-ethoxynaphthalen-1-yl)tetrahydrothiophenium perfluoro-n-octylsulfonate, 1-(4-n-propoxynaphthalen-1-yl)tetrahydrothiophenium trifluoromethanesulfonate, 1-(4-n-propoxynaphthalen-1-yl)tetrahydrothiophenium perfluoro-n-butylsulfonate, 1-(4-n-propoxynaphthalen-1-yl)tetrahydrothiophenium perfluoro-n-octylsulfonate, 1-(4-n-butoxynaphthalen-1-yl)tetrahydrothiophenium trifluoromethanesulfonate, 1-(4-n-butoxynaphthalen-1-yl)tetrahydrothiophenium perfluoro-n-butylsulfonate, 1-(4-n-butoxynaphthalen-1-yl)tetrahydrothiophenium perfluoro-n-octylsulfonate, 2-(7-methoxy naphthalen-2-yl)tetrahydrothiophenium trifluoromethanesulfonate, 2-(7-methoxynaphthalen-2-yl)tetrahydrothiophenium perfluoro-n-butylsulfonate, 2-(7-methoxynaphthalen-2-yl)tetrahydrothiophenium perfluoro-n-octylsulfonate, 2-(7-ethoxynaphthalen-2-yl)tetrahydrothiophenium trifluoromethanesulfonate, 2-(7-ethoxynaphthalen-2-yl)tetrahydrothiophenium perfluoro-n-butylsulfonate, 2-(7-ethoxynaphthalen-2-yl)tetrahydrothiophenium perfluoro-n-octylsulfonate, 2-(7-n-propoxynaphthalen-2-yl)tetrahydrothiophenium trifluoromethanesulfonate, 2-(7-n-propoxynaphthalen-2-yl)tetrahydrothiophenium perfluoro-n-butylsulfonate, 2-(7-n-propoxynaphthalen-2-yl)tetrahydrothiophenium perfluoro-n-octylsulfonate, 2-(7-n-butoxynaphthalen-2-yl)tetrahydrothiophenium trifluoromethanesulfonate, 2-(7-n-butoxynaphthalen-2-yl)tetrahydrothiophenium perfluoro-n-butylsulfonate, and 2-(7-n-butoxy naphthalen-2-yl)tetrahydrothiophenium perfluoro-n-octylsulfonate can be given.

Examples of a halogen-containing compound include a haloalkyl group-containing hydrocarbon compound and a haloalkyl group-containing heterocyclic compound. Specific examples include (trichloromethyl)-s-triazine derivatives such as phenylbis(trichloromethyl)-s-triazine, 4-methoxyphenylbis(trichloromethyl)-s-triazine, and 1-naphthylbis(trichloromethyl)-s-triazine; 1,1-bis(4-chlorophenyl)-2,2,2-trichloroethane; and the like.

As examples of a diazoketone compound, 1,3-diketo-2-diazo compounds, diazobenzoquinone compounds, and diazonaphthoquinone compounds can be given. As specific examples of a diazoketone compound, 1,2-naphthoquinonediazide-4-sulfonyl chloride, 1,2-naphthoquinonediazide-5-sulfonyl chloride, 1,2-naphthoquinonediazide-4-sulfonate or 1,2-naphthoquinonediazide-5-sulfonate or 2,3,4,4'-tetrahydroxybenzophenone, and 1,2-naphthoquinonediazide-4-sulfonate or 1,2-naphthoquinonediazide-5-sulfonate of 1,1,1-tris(4-hydroxyphenyl)ethane can be given.

As examples of a sulfone compound, β-ketosulfone, β-sulfonylsulfone, and α-diazo compounds of these compounds can be given. More specific examples include 4-trisphenacylsulfone, mesitylphenacylsulfone, bis(phenylsulfonyl)methane, and the like.

As examples of a sulfonic acid compound, alkyl sulfonates, alkylimide sulfonates, haloalkyl sulfonates, aryl sulfonates, and imino sulfonates can be given. More specific examples include, benzointosylate, pyrogallol tris(trifluoromethanesulfonate), nitrobenzyl-9,10-diethoxyanthracene-2-sulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octylsulfonylbicyclo[2.2.1]hept-5-ene-2,3-dicarbodiimide, 2-bicyclo[2.2.1]hept-2-yl-1,1,2,2-tetrafluoroethanesulfonyl-bicyclo[2.2.1]hept-5-ene-2,3-dicarbodiimide, N-(trifluoromethanesulfonyloxy)succinimide, N-(nonafluoro-n-butylsulfonyloxy)succinimide, N-(perfluoro-n-octylsulfonyloxy)succinimide, N-(2-bicyclo[2.2.1]hept-2-yl-1,1,2,2-tetrafluoroethanesulfonyloxy)succinimide, 1,8-naphthalenedicarboxylic acid imide trifluoromethanesulfonate, 1,8-naphthalenedicarboxylic acid imide nonafluoro-n-butylsulfonate, 1,8-naphthalenedicarboxylic acid imide perfluoro-n-octylsulfonate, and the like.

[1-4] Nitrogen-Containing Compound (D)

In addition to the first polymer (A), the second polymer (B), and the radiation-sensitive acid generator (C), the radiation-sensitive composition may further include a nitrogen-containing compound (D). The nitrogen-containing compound (D) controls diffusion of an acid generated by the acid generator upon exposure in a resist film to hinder undesired chemical reactions in the unexposed area. Specifically, the nitrogen-containing compound (D) functions as an acid diffusion controller.

The addition of the nitrogen-containing compound (D) improves storage stability of the resulting radiation-sensitive composition and resolution as a resist and prevents the line width of a resist pattern from changing due to changes in the post-exposure delay (PED) between exposure and post-exposure heat treatment, whereby a composition with remarkably superior process stability can be obtained.

As examples of a nitrogen-containing compound (D), a nitrogen-containing compound (d1) shown by the following formula (11) can be suitably used.

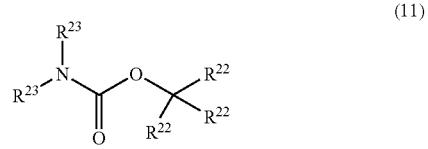

(11)

wherein $R^{22}$ and $R^{23}$ individually represent a hydrogen atom, a linear, branched, or cyclic alkyl group having 1 to 20 carbon atoms which may be either substituted or unsubstituted, an aryl group, or an aralkyl group, or $R^{22}$ or $R^{23}$ bond among themselves to form a saturated or unsaturated divalent hydrocarbon group or a derivative thereof together with the carbon atom to which $R^{22}$ bond or the nitrogen atom to which $R^{23}$ bond, As examples of the nitrogen-containing compound (d-1) shown by the above formula (11), N-t-butoxycarbonyl group-containing amino compounds such as N-t-butoxycarbonyl-di-n-octylamine, N-t-butoxycarbonyl-di-n-nonylamine, N-t-butoxycarbonyl-di-n-decylamine, N-t-butoxycarbonyl dicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidinemethanol, (R)-(+)-1-(t-butoxycarbonyl)-2-pyrrolidinemethanol, N-t-butoxycarbonyl-4-hydroxypiperidine, N-t-butoxycarbonylpyrrolidine, N-t-butoxycarbonylpiperazine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N',N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole can be given.

In addition to the above nitrogen-containing compound (d1) shown by the formula (11), the nitrogen-containing compound (D) may include a tertiary amine compound, a quaternary ammonium hydroxide compound, a nitrogen-containing heterocyclic compound, and the like.

Examples of a tertiary amine include tri(cyclo)alkylamines such as triethylamine, tri-n-propylamine, tri-n-butylamine, tri-n-pentylamine, tri-n-hexylamine, tri-n-heptylamine, tri-n-octylamine, cyclohexyldimethylamine, dicyclohexylmethylamine, and tricyclohexylamine.

As examples of a quaternary ammonium hydroxide compound, tetra-n-propylammonium hydroxide, and tetra-n-butylammonium hydroxide can be given.

Examples of a nitrogen-containing heterocyclic compound include pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine, 1-(2-hydroxyethyl)piperazine; pyrazine, pyrazole, pyridazine, quinoxaline, purine, pyrrolidine, piperidine, 3-piperidino-1,2-propanediol, morpholine, 4-methylmorpholine, 1,4-dimethylpiperazine, 1,4-diazabicyclo[2.2.2]octane, imidazole, 4-methylimidazole, 1-benzyl-2-methylimidazole, 4-methyl-2-phenylimidazole, benzimidazole, and 2-phenylbenzimidazole.

In addition to the above nitrogen-containing compounds, aromatic amines such as aniline, N-methylaniline, N,N-dimethylaniline, 2-methylaniline, 3-methylaniline, 4-methylaniline, 4-nitroaniline, 2,6-dimethylaniline, and 2,6-diisopropylaniline; alkanolamines such as triethanolamine and N,N-di(hydroxyethyl)aniline; N,N,N',N'-tetramethylethylenediamine, N,N,N',N'-tetrakis(2-hydroxypropyl)ethylenediamine, 1,3-bis[1-(4-aminophenyl)-1-methylethyl]benzene tetramethylenediamine, bis(2-dimethylaminoethyl)ether, and bis(2-diethylaminoethyl)ether; and the like may be used.

Either one of these nitrogen-containing compounds (D) may be used alone or a mixture of two or more of them may be used.

The amount of the nitrogen-containing compound (D) used in the radiation-sensitive composition is preferably 10 parts by mass or less, and more preferably 5 parts by mass relative to 100 parts by mass of the first polymer (A) from the viewpoint of ensuring high sensitivity as a resist. If the amount of the nitrogen-containing compound (D) is more than 10 parts by mass, the sensitivity as a resist may be unduly impaired. If the amount of the acid diffusion controller (D) is less than 0.001 part by mass, the pattern shape and dimensional accuracy as a resist may decrease depending on the process conditions.

[1-5] Additives (E)

Additives (E) such as an alicyclic skeleton-containing resin (e1), a surfactant (e2), a surfactant (e2), and a sensitizer (e3) can be optionally added to the radiation-sensitive composition. The amount of each additive may be appropriately determined according to the purpose.

The alicyclic skeleton-containing additive (e1) used as the additive (E) is a component which further improves the dry etching resistance, pattern shape, adhesion to a substrate, and the like.

As examples of the alicyclic skeleton-containing resin (e1), adamantane derivatives such as 1-adamantane carboxylate, 2-adamantanon, t-butyl-1-adamantane carboxylate, t-butoxycarbonylmethyl-1-adamantane carboxylate, α-butyrolactone-1-adamantane carboxylate, di-t-butyl-1,3-adamantanedicarboxylate, t-butyl-1-adamantane acetate, t-butoxycarbonylmethyl-1-adamantane acetate, di-t-butyl-1,3-adamantane diacetate, and 2,5-dimethyl-2,5-di (adamantylcarbonyloxy)hexane;

deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; alkylcarboxylates such as dimethyl adipate, diethyl adipate, dipropyl adipate, di-n-butyl adipate, and di-t-butyl adipate;

3-[2-hydroxy-2,2-bis(trifluoromethyl)ethyl]tetracyclo[4.4.0.1$^{2,5}$.1$^{7,10}$]dodecane, 2-hydroxy-9-methoxycarbonyl-5-oxo-4-oxa-tricyclo[4.2.1.0$^{3,7}$]nonane, and the like can be given. Either one of these alicyclic skeleton-containing additives (e1) may be used alone or a mixture of two or more of them may be used.

The surfactant (e2) as the additive (E) improves applicability, striation, developability, and the like.

As examples of the surfactant (e2), nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate; commercially available products such as "KP341" (manufactured by Shin-Etsu Chemical Co., Ltd.), "Polyflow No. 75" and "Polyflow No. 95" (manufactured by Kyoeisha Chemical Co., Ltd.), "EFTOP EF301", "EFTOP EF303", and "EFTOP EF352" (manufactured by JEMCO, Inc.), "MEGAFAC F171" and "MEGAFAC F173" (manufactured by Dainippon Ink and Chemicals, Inc.), "Fluorad FC430" and "Fluorad FC431" (manufactured by Sumitomo 3M Ltd.), "Asahi Guard AG710", "Surflon S-382", "Surflon SC-101", "Surflon SC-102", "Surflon SC-103", "Surflon SC-104", "Surflon SC-105", and "Surflon SC-106" (manufactured by Asahi Glass Co., Ltd.), and the like can be given. Either one of these surfactants may be used alone or a mixture of two or more of them may be used.

The sensitizer (e3) used as the additive (E) absorbs radiation energy and transmits the energy to the acid generator (C), thereby increasing the amount of an acid generated upon exposure. The sensitizers improve apparent sensitivity of the radiation-sensitive composition.

As examples of the sensitizer (e3), carbazoles, acetophenones, benzophenones, naphthalenes, phenols, biacetyl, eosin, rose bengal, pyrenes, anthracenes, phenothiazines, and the like can be given. Either one of these sensitizers (e3) may be used alone or a mixture of two or more of them may be used.

At least one additive selected from the group consisting of a dye, a pigment, and an adhesion adjuvant may be further used as the additive (E). A dye or a pigment visualizes a latent image in the exposed area, thereby decreasing the effect of halation during exposure. Use of an adhesion adjuvant as the additive (E) improves the adhesion to a substrate. As other additives, low molecular weight alkali solubility controllers containing an alkali soluble resin and/or an acid dissociable protecting group, halation inhibitors, preservation stabilizers, antifoaming agents, and the like can be given.

Either one type of the additives (E) described above may be used alone or a mixture of two or more of them may be used in combination, as required.

[1-5] Solvent (F)

Any solvent capable of dissolving the first polymer (A), the second polymer (B), and the radiation-sensitive acid generator (C) may be used as the solvent (F) without any specific limitation. However, when the radiation-sensitive composition further includes a nitrogen-containing compound (D) and an additive (E), a solvent which can dissolve these components is preferably used.

As the solvent (F), propylene glycol monoalkyl ether acetates such as propylene glycol monomethyl ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; cyclic ketones such as cyclopentanone, 3-methylcyclopentanone, cyclohexanone, 2-methylcyclohexanone, 2,6-dimethylcyclohexanone, and isophorone;

linear or branched ketones, e.g., ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate;

n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, dimethylene glycol di-n-propyl ether, dimethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, 2-hydroxy-2-methylethylpropionate, ethyl ethoxyacetate, ethyl hydroxyacetate, methyl 2-hydroxy-3-methylbutyrate, 3-methoxybutyl acetate, 3-methyl-3-methoxybutyl acetate, 3-methyl-3-methoxybutyl propionate, 3-methyl-3-methoxybutyl butyrate, ethyl acetate, n-propyl acetate, n-butyl acetate, methyl acetoacetate, ethyl acetoacetate, methyl pyruvate, ethyl pyruvate, N-methyl pyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, and propylene carbonate can be given.

Of these, propylene glycol monoalkyl ether acetates, particularly propylene glycol monomethyl ether acetate and propylene glycol monoethyl ether acetate are preferable. Cyclic ketones, linear or branched ketones, alkyl 2-hydroxypropionates, alkyl 3-alkoxypropionate, γ-butyrolactone, and the like are also preferable. Either one of these solvents may be used alone or a mixture of two or more of them may be used.

[2] Formation of Photoresist Pattern

The radiation-sensitive composition of the present invention is particularly useful as a chemically-amplified resist. In the chemically-amplified resist, an acid-dissociable group in the polymers included in the radiation-sensitive composition dissociates by the action of an acid generated by the acid generator upon exposure, thereby producing a carboxyl group. As a result, solubility of the exposed part of the resist in an alkaline developer increases, whereby the exposed part is dissolved in an alkaline developer and removed to obtain a positive-tone photoresist pattern.

As a method for forming a photoresist pattern using the radiation-sensitive composition of the present invention, a method including (1) a step of forming a photoresist film on a substrate using the above-mentioned radiation-sensitive composition (hereinafter referred to from time to time as "step (1)"), (2) a step of exposing the photoresist film to radiation through a mask having a predetermined pattern, optionally through an immersion medium (hereinafter referred to from time to time as "step (2)"), and (3) a step of developing the exposed photoresist film to form a photoresist pattern (hereinafter referred to from time to time as "step (3)") can be given.

The pattern-forming method of the present invention may optionally further include a step of forming an immersion liquid protecting film insoluble in the immersion liquid on a resist film prior to the step (2) in order to prevent direct contact of the liquid used for liquid immersion lithography and the resist film.

As the immersion liquid protecting film, a solvent peeling-type protecting film which is peeled by a solvent prior to the step (3) disclosed in Japanese Patent Application Publication (KOKAI) No. 2006-227632, for example, or a developer peeling-type protecting film which is peeled during development of the step (3) disclosed in WO 2005-069076 and WO 2006-035790, for example, can be given. The immersion liquid protecting film is not particularly limited to these types of film. However, the developer peeling-type protecting film is preferred from the viewpoint of throughput and the like.

In the step (1), a photoresist film is formed by applying a polymer solution obtained by dissolving the radiation-sensitive composition of the present invention in a solvent to a substrate such as a silicon wafer or a wafer coated with silicon dioxide by an appropriate application method such as rotational coating, cast coating, and roll coating. Specifically, after applying the radiation-sensitive composition solution in an amount to obtain a resist film with a prescribed thickness, the resist film can be formed by prebaking (PB) the coating to volatilize the solvent from the coating.

Although not particularly limited, the thickness of the resist film is preferably 0.1 to 5 μm, and more preferably 0.1 to 2 μm.

The prebake temperature varies depending on the composition of the radiation-sensitive composition, but is preferably 30 to 200° C., and more preferably 50 to 150° C.

In order to bring out the potential of the resist film using the radiation-sensitive composition of the present invention to the maximum extent in forming a photoresist pattern, an organic or inorganic antireflection film may be formed on the substrate as disclosed in Japanese Patent Publication (KOKOKU) No. 6-12452 (Japanese Patent Application Publication (KOKAI) No. 59-93448), for example.

In addition, a protective film may be provided on the resist film in order to prevent an adverse effect of basic impurities and the like that are present in the environmental atmosphere using a method described in, for example, Japanese Patent Application Publication (KOKAI) No. 5-188598. Further, the above immersion liquid protecting film may be provided on the photoresist film. These techniques may be used in combination.

Next, in the step (2), a selected area of the photoresist film formed in the step (1) is exposed to radiation, occasionally via an immersion liquid medium such as water. In this instance, radiation is applied through a mask having a predetermined pattern.

As radiation used for exposure, visible rays, ultraviolet rays, deep ultraviolet rays, X-rays, electron beams, or the like are appropriately selected depending on type of the acid generator. It is particularly preferable to use an ArF excimer laser (wavelength: 193 nm) or KrF excimer laser (wavelength: 248 nm). An ArF excimer laser (wavelength: 193 nm) is particularly preferable.

The exposure conditions such as an amount of exposure are appropriately determined according to the composition of the radiation-sensitive composition, the type of additives, and the like. When using the radiation-sensitive composition of the present invention in photoresist pattern forming, it is preferable to perform a heat treatment (post-exposure bake: PEB) after exposure. PEB ensures smooth dissociation of an acid-dissociable group in the radiation-sensitive composition. The PEB temperature varies depending on the composition of the radiation-sensitive composition, but is preferably 30 to 200° C., and more preferably 50 to 170° C.

In the step (3), the photoresist film after exposure is developed using a developer to form a predetermined photoresist resist pattern. As a developer, an aqueous alkaline solution prepared by dissolving at least one alkaline compound selected from sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, 1,5-diazabicyclo-[4.3.0]-5-nonene, and the like is preferably used.

The concentration of the aqueous alkaline solution used as a developer is preferably 10 mass % or less. If the concentration of the alkaline aqueous solution exceeds 10 mass %, for example, an unexposed part may be dissolved in the developer.

An organic solvent or the like may be added to the developer containing the aqueous alkaline solution. As examples of the organic solvent, ketones such as acetone, methyl ethyl ketone, methyl i-butyl ketone, cyclopentanone, cyclohexanone, 3-methylcyclopentanone, and 2,6-dimethylcyclohexanone; alcohols such as methyl alcohol, ethyl alcohol, n-propyl alcohol, i-propyl alcohol, n-butyl alcohol, t-butyl alcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide; and the like can be given. Either one of these organic solvents may be used alone or a mixture of two or more of them may be used.

The amount of the organic solvent used is preferably 100 vol % or less for 100 vol % of the alkaline aqueous solution. An amount of the organic solvent exceeding 100 vol % may decrease developability, giving rise to a larger undeveloped portion in the exposed area.

In addition, an appropriate amount of a surfactant and the like may be added to the developer containing the alkaline aqueous solution. After development using the alkaline aqueous solution developer, the resist film is usually washed with water and dried.

EXAMPLES

The present invention is described below in detail based on examples. However, the present invention is not limited to the following examples. In the examples, "part" refers to "parts by mass" and "%" refers to "mass %" unless otherwise indicated. Each property value measuring method and each property evaluation method are given below.

[Mw, Mn, and Mw/Mn]

Mw and Mn were measured by gel permeation chromatography (GPC) using monodispersed polystyrene as a standard and using GPC columns (manufactured by Tosoh Corp., G2000HXL×2, G3000HXL×1, G4000HXL×1) at a flow rate of 1.0 ml/minute, using tetrahydrofuran as an eluent, at a column temperature of 40° C. Dispersibility (Mw/Mn) was calculated from the Mw and Mn measurement results.

[$^{13}$C-NMR Analysis]

$^{13}$C-NMR analysis of each polymer was carried out using "JNM-EX270" manufactured by JEOL Ltd.

[Residual Rate of Low-Molecular-Weight Components]

The amount of low-molecular-weight components was measured by high performance liquid chromatography (HPLC) using an "Intersil ODS-25 μm column" (internal diameter: 4.6 mm, length: 250 mm) manufactured by GL Sciences Inc., at a flow rate of 1.0 ml/min using an acrylonitrile/0.1% phosphoric acid aqueous solution as an eluent. The low-molecular-weight components are monomers with a molecular weight of less than 1000 (i.e. trimers and monomers with a smaller molecular weight) as a major component.

[Sensitivity (1)]

First, an underlayer antireflection film with a thickness of 77 nm ("ARC29A" manufactured by Brewer Science, Inc.) was formed on the surface of an 8-inch silicon wafer using a coater/developer (1) ("CLEAN TRACK ACT8" manufactured by Tokyo Electron, Ltd.) to obtain a substrate.

Next, a radiation-sensitive composition prepared in each Example and Comparative Example was applied by spin-coating to the above substrate using a coater/developer (1) and baked (PB) under the conditions shown in Table 3 to form a resist film with a thickness of 120 nm The resist films were exposed to radiation through a mask pattern using an ArF excimer laser exposure apparatus ("NSR S306C" manufactured by Nikon Corp., NA 0.78, sigma 0.93/0.69). After PEB under the conditions shown in Table 3, the resist pattern was developed at 23° C. for 30 seconds in a 2.38 mass % tetramethylammonium hydroxide aqueous solution, washed with water, and dried to form a positive-tone resist pattern.

An amount of exposure (mJ/cm$^2$) to form a resist pattern with a line width of 90 nm and a distance between lines of 90 nm (line-and-space, 1:1) was regarded as an optimum exposure dose. This optimum exposure dose was evaluated as sensitivity (shown as "sensitivity (1) (mJ/cm$^2$)" in Table 4). A scanning electron microscope ("S-9380" manufactured by Hitachi High-Technologies Corporation) was used for measuring the line width and the distance between lines.

[Resolution (1)]

Among the line widths of the line-and-space resist pattern formed in the evaluation of sensitivity (1), the minimum line width (nm) was evaluated as resolution (shown as "resolution (1) (nm)" in Table 4). The smaller the value, the better the resolution.

[LWR (Line Width Roughness)]

In the observation of a 90 nm line-and-space pattern resolved at an optimum exposure dose in the above evaluation of sensitivity (1), line widths were observed from the top of the pattern at arbitrary points using the same scanning electron microscope as that used in the evaluation of sensitivity (1) to evaluate the dispersion by $3\sigma$ (nm).

[Sensitivity (2)]

An underlayer antireflection film with a thickness of 77 nm ("ARC29A" manufactured by Brewer Science, Inc.) was formed on the surface of a 12-inch silicon wafer using a coater/developer (2) ("CLEAN TRACK ACT12" manufactured by Tokyo Electron, Ltd.) to obtain a substrate.

Next, the radiation-sensitive composition was applied by spin-coating to the above substrate using a coater/developer (2) and baked (PB) under the conditions shown in Table 3 to form a resist film with a thickness of 120 nm "NFC TCX041" (manufactured by JSR Corp.) was further applied by spin-coating onto the resist film using a coater/developer (2) and baked at 90° C. for 60 seconds to form an immersion liquid protecting film. The resist films were exposed to radiation through a mask pattern using an ArF excimer laser exposure apparatus ("ASML AT1250i" manufactured by ASML, NA=0.85, $\sigma0/\sigma1$=0.96/0.76, Dipole). Pure water was used as an immersion liquid medium between the resist surface and the lens of the liquid immersion lithographic instrument. After PEB under the conditions shown in Table 3, the resist pattern was developed at 23° C. for 60 seconds in a 2.38 mass % tetramethylammonium hydroxide aqueous solution, washed with water, and dried to form a positive-tone resist pattern.

An amount of exposure (mJ/cm$^2$) to form a resist pattern with a line width of 65 nm and a distance between lines of 65 nm (line-and-space, 1:1) was regarded as an optimum exposure dose. This optimum exposure dose was evaluated as sensitivity (shown as "sensitivity (2) (mJ/cm$^2$)" in Table 4). The same scanning electron microscope as that used for the evaluation of sensitivity (1) was used for measuring the line width and the distance between lines.

[Resolution (2)]

Among the line widths of the line-and-space resist pattern formed in the evaluation of sensitivity (2), the minimum line width (nm) was evaluated as resolution (shown as "resolution (2) (nm)" in Table 4). The smaller the value, the better the resolution.

[Pattern Cross-Section Configuration]

The cross-section configuration of the 65 nm line-and-space pattern of the resist film obtained in the evaluation of sensitivity (2) was observed using a scanning electron microscope ("S-4800" manufactured by Hitachi High-Technologies Corporation) to measure the line width Lb at the middle of the resist pattern and the line width on the top of the film. In the case where the value calculated by the formula (La−Lb)/Lb based on the above results satisfied the formula $0.9 \leq$ (La−Lb)/Lb$\leq 1.1$, the pattern cross-section configuration was judged as "Good", otherwise it was judged as "Bad".

[Watermark Defects and Bubble Defects]

An underlayer antireflection film with a thickness of 77 nm ("ARC29A" manufactured by Brewer Science, Inc.) was formed on the surface of a 12-inch silicon wafer using the above coater/developer (2). The resulting 12-inch silicon wafer was used as a substrate.

Next, the radiation-sensitive composition was applied by spin-coating to the above substrate using a coater/developer (2) and baked (PB) under the conditions shown in Table 3 to form a photoresist film with a thickness of 120 nm "NFC TCX041" (manufactured by JSR Corp.) was further applied by spin-coating onto the photoresist film using a coater/developer (2) and baked at 90° C. for 60 seconds to form an immersion liquid protecting film. The photoresist films were exposed to radiation through a mask pattern using an ArF excimer laser exposure apparatus ("ASML AT1250i" manufactured by ASML, NA=0.85, $\sigma0/\sigma1$=0.96/0.76, Annular). Pure water was used as an immersion liquid medium between the resist surface and the lens of the liquid immersion lithographic instrument.

After PEB under the conditions shown in Table 3, the resist pattern was developed at 23° C. for 60 seconds in a 2.38 mass % tetramethylammonium hydroxide aqueous solution, washed with water, and dried to form a positive-tone resist pattern. An optimum dose at which a line-and-space (1L1S) pattern with a line width of 100 nm was formed was taken as sensitivity (3). The same scanning electron microscope as that used for the evaluation of sensitivity (1) was used for the measurement.

The number of defects on the line-and-space (1L1S) pattern with a line width of 100 nm was measured using "KLA2351" manufactured by KLA-Tencor Corp. In addition, the defects measured by "KLA2351" were observed using the above scanning electron microscope to classify the defects into watermark defects, which are thought to originate from exposure to an ArF excimer laser by liquid immersion lithography and bubble defects.

(Synthesis of Polymer (A))

In each of the Synthesis Examples, the following compounds (M-1) to (M-8) were used to synthesize polymers. The compounds (M-1) to (M-8) have structures respectively shown by the following formulas (M-1) to (M-8).

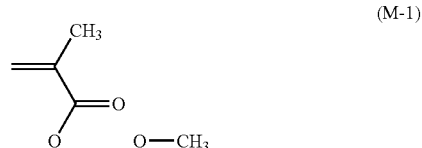

(M-1)

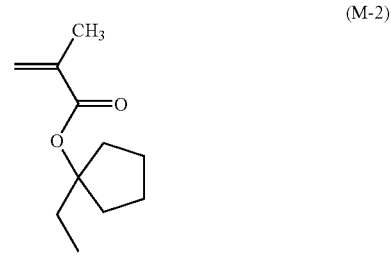

(M-2)

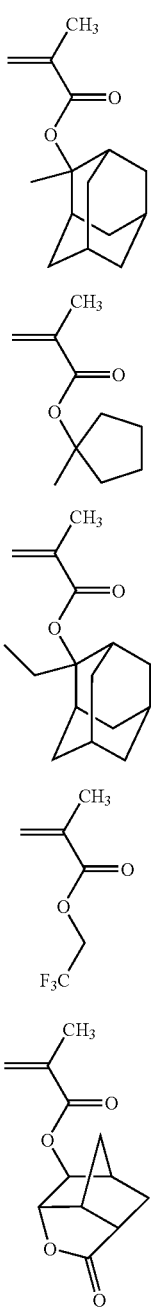

(M-3)

(M-4)

(M-5)

(M-6)

(M-7)

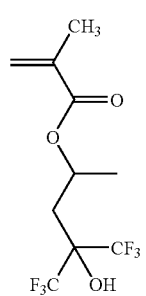

(M-8)

Synthesis Example 1

Polymer (A-1)

A monomer solution was prepared by dissolving 27.51 g (50 mol %) of the compound (M-1), 5.29 g (15 mol %) of the compound (M-2), and 17.20 g (35 mol %) of the compound (M-3) in 100 g of 2-butanone, and further adding 1.72 g (5 mol %) of azobis(isobutylonitrile) (indicated as "AIBN" in Table 1).

A 500 ml three-necked flask equipped with a thermometer and a dropping funnel was charged with 50 g of 2-butanone and purged with nitrogen for 30 minutes. After the nitrogen purge, the flask was heated to 80° C. while stirring the contents using a magnetic stirrer, and the above monomer solution was added dropwise using a dropping funnel over 3 hours. The polymerization reaction was carried out for 6 hours after initiation of dropping.

After polymerization, the polymer solution was cooled with water to 30° C. or less. After cooling, the reaction mixture was poured into 1000 g of methanol, and a white powder which deposited was separated by filtration. The white powder collected by filtration was washed twice with 200 g of methanol in a slurry state, filtered again, and dried at 50° C. for 17 hours to obtain a polymer in the form of a white powder (37 g, yield 73%). This copolymer is referred to as polymer (A-1).

The copolymer has an Mw of 6420, an Mw/Mn ratio of 1.58, and the mol % ratio of the repeating units of compound (M-1), compound (M-2), and compound (M-3) determined by $^{13}$C-NMR analysis was 51.1:14.9:34.0 (mol %). The amount of residual low-molecular-weight components in the copolymer was 0.04 mass %. The results are shown in Table 2.

TABLE 1

| Synthesis Example | | Monomer 1 | | Monomer 2 | | Monomer 3 | | Initiator | |
|---|---|---|---|---|---|---|---|---|---|
| | | Name | Amount (mol %) | Name | Amount (mol %) | Name | Amount (mol %) | Name | Amount (mol %) |
| Synthesis-Example 1 | A-1 | M-1 | 50 | M-2 | 15 | M-3 | 35 | AIBN | 5 |
| Synthesis-Example 2 | A-2 | M-1 | 50 | M-4 | 35 | M-5 | 15 | AIBN | 5 |
| Synthesis Example 3 | B-1 | M-1 | 20 | M-2 | 50 | M-6 | 30 | MAIB | 8 |
| Synthesis Example 4 | B-2 | M-1 | 20 | M-2 | 30 | M-8 | 50 | MAIB | 8 |
| Synthesis Example 5 | B-3 | M-7 | 20 | M-2 | 50 | M-6 | 30 | MAIB | 8 |
| Synthesis Example 6 | B-4 | M-7 | 20 | M-2 | 30 | M-8 | 50 | MAIB | 8 |

TABLE 2

| | | Repeating unit 1 | | Repeating unit 2 | | Repeating unit 3 | | | Molecular weight | | Amount of residual low-molecular-weight |
|---|---|---|---|---|---|---|---|---|---|---|---|
| | | | Amount | | Amount | | Amount | | | | |
| Synthesis Example | | Monomer | (mol %) | Monomer | (mol %) | Monomer | (mol %) | Yield (%) | Mw | Mw/Mn | components (mass %) |
| Synthesis Example 1 | A-1 | M-1 | 51.1 | M-2 | 14.9 | M-3 | 34 | 73 | 6420 | 1.58 | 0.04 |
| Synthesis Example 2 | A-2 | M-1 | 50.4 | M-4 | 34.8 | M-5 | 14.8 | 75 | 6250 | 1.58 | 0.05 |
| Synthesis Example 3 | B-1 | M-1 | 20.6 | M-2 | 49.1 | M-6 | 30.3 | 74 | 4320 | 1.52 | 0.05 |
| Synthesis Example 4 | B-2 | M-1 | 20.8 | M-2 | 30.1 | M-8 | 49.1 | 71 | 4450 | 1.55 | 0.05 |
| Synthesis Example 5 | B-3 | M-7 | 21.2 | M-2 | 48.6 | M-6 | 30.2 | 73 | 4410 | 1.53 | 0.04 |
| Synthesis Example 6 | B-4 | M-7 | 21.4 | M-2 | 29.1 | M-8 | 49.5 | 69 | 4620 | 1.51 | 0.04 |

Synthesis Examples 2 to 6

Polymer (A-2) and Polymers (B-1) to (B-4)

Polymer (A-2) and polymers (B-1) to (B-4) were synthesized in the same manner as Synthesis Example 1, except for using components in amounts shown in Table 1. Dimethyl-2,2'-azobis-iso-butyrate (indicated as "MAIB" in Table 1) was used as an initiator in Synthesis Examples 3 to 6.

The ratio of the repeating units (mol %) determined by $^{13}$C-NMR analysis, yield (%), Mw, the molecular weight dispersion (Mw/Mn), and the amount of residual low-molecular-weight components in the polymer (A-1) and polymers (B-1) to (B-4) are shown in Table 2.

(Preparation of Radiation-Sensitive Compositions)

The composition of the radiation-sensitive compositions prepared in the Examples and Comparative Examples, and heating conditions before and after exposure (PB and PEB) are shown in Table 3. The components forming the radiation-sensitive compositions other than the polymers (A-1) and (A-2), and polymers (B-1) to (B-4) synthesized in the above Synthesis Examples, that is, the radiation-sensitive acid generators (C), nitrogen-containing compounds (D), and solvents (F), are shown below.

<Photoacid Penerator (C)>
(C-1): triphenylsulfonium.nonafluoro-n-butanesulfonate
(C-2): 1-(4-n-butoxynaphthalen-1-yl)tetrahydrothiophenium nonafluoro-n-butanesulfonate <Nitrogen-Containing Compound (D)>
(D-1): N-t-butoxycarbonyl-4-hydroxypiperidine Solvent (F)
(F-1): Propylene glycol monoethyl ether acetate
(F-2): cyclohexanone
(F-3): γ-butyrolactone

TABLE 3

| | First polymer (A) | | Second polymer (B) | | Acid generator (C) | | Nitrogen-containing compound (D) | | Solvent (F) | | PB | | PEB | |
|---|---|---|---|---|---|---|---|---|---|---|---|---|---|---|
| | | Parts by | | Parts by | | Parts by | | Parts by | | Parts by | | | | |
| Example | Name | mass | Name | mass | Name | mass | Name | mass | Name | mass | Temp. | Time | Temp. | Time |
| Example 1 | A-1 | 100 | B-1 | 5.0 | C-1 | 7.0 | D-1 | 1.12 | F-1 | 1400 | 110 | 60 | 115 | 60 |
| | | | | | C-2 | 2.0 | | | F-2 | 600 | | | | |
| | | | | | | | | | F-3 | 30 | | | | |
| Example 2 | A-2 | 100 | B-1 | 5.0 | C-1 | 7.0 | D-1 | 1.53 | F-1 | 1400 | 110 | 60 | 100 | 60 |
| | | | | | C-2 | 2.0 | | | F-2 | 600 | | | | |
| | | | | | | | | | F-3 | 30 | | | | |
| Example 3 | A-1 | 100 | B-2 | 5.0 | C-1 | 7.0 | D-1 | 1.12 | F-1 | 1400 | 110 | 60 | 115 | 60 |
| | | | | | C-2 | 2.0 | | | F-2 | 600 | | | | |
| | | | | | | | | | F-3 | 30 | | | | |
| Example 4 | A-2 | 100 | B-2 | 5.0 | C-1 | 7.0 | D-1 | 1.53 | F-1 | 1400 | 110 | 60 | 100 | 60 |
| | | | | | C-2 | 2.0 | | | F-2 | 600 | | | | |
| | | | | | | | | | F-3 | 30 | | | | |
| Comparative Example 1 | A-1 | 100 | B-3 | 5.0 | C-1 | 7.0 | D-1 | 1.12 | F-1 | 1400 | 110 | 60 | 115 | 60 |
| | | | | | C-2 | 2.0 | | | F-2 | 600 | | | | |
| | | | | | | | | | F-3 | 30 | | | | |
| Comparative Example 2 | A-2 | 100 | B-3 | 5.0 | C-1 | 7.0 | D-1 | 1.53 | F-1 | 1400 | 110 | 60 | 100 | 60 |
| | | | | | C-2 | 2.0 | | | F-2 | 600 | | | | |
| | | | | | | | | | F-3 | 30 | | | | |
| Comparative Example 3 | A-1 | 100 | B-4 | 5.0 | C-1 | 7.0 | D-1 | 1.12 | F-1 | 1400 | 110 | 60 | 115 | 60 |
| | | | | | C-2 | 2.0 | | | F-2 | 600 | | | | |
| | | | | | | | | | F-3 | 30 | | | | |
| Comparative Example 4 | A-2 | 100 | B-4 | 5.0 | C-1 | 7.0 | D-1 | 1.53 | F-1 | 1400 | 110 | 60 | 100 | 60 |
| | | | | | C-2 | 2.0 | | | F-2 | 600 | | | | |
| | | | | | | | | | F-3 | 30 | | | | |

Example 1

100 parts by mass of polymer (A-1) obtained in Synthesis Example 1, 5.0 parts by mass of polymer (B-1), 7.0 parts by mass of triphenylsulfonium nonafluoro-n-butanesulfonate (C-1), 2.0 parts by mass of 1-(4-n-butoxynaphthalen-1-yl) tetrahydrothiophenium nonafluoro-n-butanesulfonate (C-2) as radiation-sensitive acid generators (C), and 1.12 parts by mass of N-t-butoxycarbonyl-4-hydroxypiperidine (D-1) as a nitrogen-containing compound (D) were mixed. 1400 parts by mass of propylene glycol monomethyl ether acetate (F-1) and 600 parts by mass of cyclohexanone (F-2) and 30 parts by mass of y-butyrolactone (F-3) as solvents (F) were added to the mixture to obtain a solution. The resulting solution was filtered through a filter with a pore diameter of 0.20 μm. The composition of the radiation-sensitive composition is shown in Table 3.

The above-described sensitivity (1), resolution (1), LWR (line roughness characteristics), sensitivity (2), resolution (2), pattern cross-section configuration, watermark defect, and bubble defect of the radiation-sensitive composition of Example 1 were evaluated. The evaluation results are shown in Table 4.

TABLE 4

| Example | Sensitivity (1) (mJ/cm$^2$) | Resolution (1) (nm) | LWR (nm) | Sensitivity (2) (mJ/cm$^2$) | Resolution (2) (nm) | Pattern cross-section configuration | Watermark defect (number of defects) | Bubble defect (number of defects) |
|---|---|---|---|---|---|---|---|---|
| Example 1 | 34.0 | 85 | 5.8 | 27.0 | 60 | Good | 3 | 0 |
| Example 2 | 37.0 | 80 | 5.6 | 32.0 | 55 | Good | 2 | 0 |
| Example 3 | 33.5 | 85 | 5.7 | 26.5 | 60 | Good | 4 | 0 |
| Example 4 | 36.5 | 80 | 5.6 | 31.5 | 55 | Good | 3 | 0 |
| Comparative Example 1 | 34.5 | 85 | 7.2 | 27.5 | 60 | Good | 6 | 0 |
| Comparative Example 2 | 37.5 | 85 | 5.9 | 32.5 | 60 | Good | 8 | 0 |
| Comparative Example 3 | 34.0 | 85 | 7.1 | 27.0 | 60 | Good | 6 | 0 |
| Comparative Example 4 | 37.0 | 85 | 6.0 | 32.0 | 60 | Good | 8 | 0 |

Examples 2 to 4 and Comparative Examples 1 to 4

Radiation-sensitive compositions of Examples 2 to 4 and Comparative Examples 1 to 4 were obtained in the same manner as in Example 1, except for using the components shown in Table 3. The above-described sensitivity (1), resolution (1), LWR (line roughness characteristics), sensitivity (2), resolution (2), pattern cross-section configuration, watermark defect, and bubble defect of the radiation-sensitive compositions of Examples 2 to 4 and Comparative Examples 1 to 4 were evaluated. The evaluation results are shown in Table 4.

(Evaluation Results)

As can be clearly seen in Table 4, the radiation-sensitive compositions of the examples which contain the polymer (B-1) or the polymer (B-2) including specific repeating units exhibited improvement not only in general resist performance such as the above-described sensitivity (1), resolution (1), and LWR (line roughness characteristics), but also resist performance required for liquid immersion lithography such as the sensitivity (2), resolution (2), pattern cross-section configuration, watermark defect, and bubble defect. In particular, inclusion of the second polymer (B) having a repeating unit shown by a specific formula (formula (M-1)) and a fluorine-containing repeating unit was found to improve surface water repellency, which results in a decrease in a defect inherent to liquid immersion lithography (i.e. a watermark defect).

INDUSTRIAL APPLICABILITY

The radiation-sensitive composition can be suitably used in a lithography process, preferably in a lithography process utilizing an ArF excimer laser as a light source. The composition of the present invention is particularly suitable for use as a chemically-amplified resist exhibiting excellent basic performance as a resist such as excellent resolution and low LWR, but also capable of suppressing watermark defects and bubble defects which are inherent to liquid immersion lithography.

The invention claimed is:

1. A radiation-sensitive composition comprising
 (A) a first polymer alkali-soluble through an action of an acid and with substantially no fluorine atom;
 (B) a second polymer having a repeating unit (b1) shown by a following formula (1) and a fluorine-containing repeating unit (b2), a content of the second polymer (B) in the composition being about 0.1 parts to about 20 parts by mass relative to 100 parts by mass of the first polymer (A); and
 (C) a radiation-sensitive acid generator,

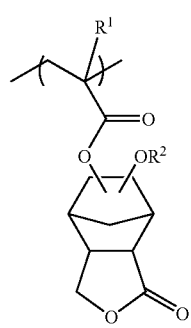

(1)

wherein $R^1$ represents a hydrogen atom, a methyl group, or a trifluoromethyl group, and $R^2$ represents a linear or branched alkyl group having 1 to 12 carbon atoms, a cycloalkyl group having 3 to 12 carbon atoms, an alkylcarbonyl group having 2 to 12 carbon atoms, or a hydroxyalkyl group having 1 to 12 carbon atoms, and wherein the repeating unit (b2) comprise at least one of a repeating unit shown by a following formula(2) and a repeating unit shown by a following formula (3),

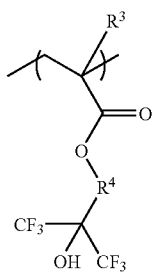

(2)

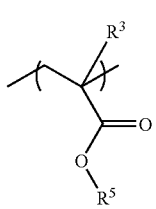

(3)

wherein $R^3$ represents a hydrogen atom, an alkyl group having 1 to 4 carbon atoms, a trifluoromethyl group, or a hydroxymethyl group, $R^4$ represents a divalent linear, branched, or cyclic hydrocarbon group, and $R^5$ represents a linear, branched, or cyclic alkyl group having 1 to 12 carbon atoms in which at least one hydrogen atom is substituted by a fluorine atom.

2. The composition according to claim 1, wherein the radiation-sensitive acid generator (C) comprises a compound shown by a following formula (4),

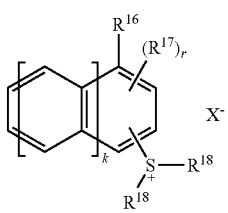

(4)

wherein $R^{16}$ represents a hydrogen atom, a fluorine atom, a hydroxyl group, a linear or branched alkyl group having 1 to 10 carbon atoms, a linear or branched alkoxy group having 1 to 10 carbon atoms, or a linear or branched alkoxycarbonyl group having 2 to 11 carbon atoms, $R^{17}$ represents a linear or branched alkyl group having 1 to 10 carbon atoms, a linear or branched alkoxy group having 1 to 10 carbon atoms, or a linear, branched, or cyclic alkanesulfonyl group having 2 to 11 carbon atoms, $R^{18}$ represents a linear or branched alkyl group having 1 to 10 carbon atoms, a substituted or unsubstituted phenyl group, or a substituted or unsubstituted naphthyl group, or a substituted or unsubstituted divalent group having 2 to 10 carbon atoms formed by $R^{18}$ and $R^{18}$ bonding to each other, k represents an integer from 0 to 2, r represents an integer from 0 to 10, and $X^-$ represents an anion shown by one of the following formulas (5-1) to (5-4), $R^{18}$ and $R^{18}$ not forming a substituted or unsubstituted divalent group having 2 to 10 carbon atoms when X represents an anion shown by the following formula (5-1),

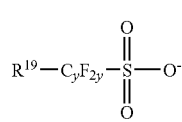

(5-1)

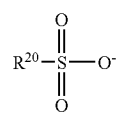

(5-2)

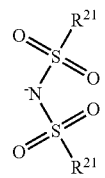

(5-3)

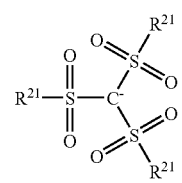

(5-4)

wherein $R^{19}$ represents a hydrogen atom, a fluorine atom, or a substituted or unsubstituted hydrocarbon group having 1 to 12 carbon atoms, y represents an integer from 1 to 10, $R^{20}$ represents a hydrocarbon group having 1 to 12 carbon atoms which is unsubstituted or substituted by an alkylcarbonyl group having 1 to 6 carbon atoms, an alkylcarbonyloxy group, or a hydroxyalkyl group, and $R^{21}$ represents a linear or branched fluoroalkyl group having 1 to 10 carbon atoms, or a substituted or unsubstituted divalent fluorine-containing group having 2 to 10 carbon atoms formed by $R^{21}$ and $R^{21}$ bonding to each other.

3. The composition according to claim 1, wherein the radiation-sensitive acid generator (C) comprises a compound shown by a following formula (4),

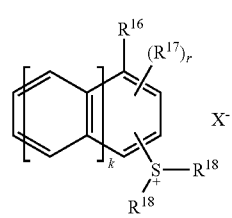

(4)

wherein $R^{16}$ represents a hydrogen atom, a fluorine atom, a hydroxyl group, a linear or branched alkyl group having 1 to 10 carbon atoms, a linear or branched alkoxy group having 1 to 10 carbon atoms, or a linear or branched alkoxycarbonyl group having 2 to 11 carbon atoms, $R^{17}$ represents a linear or branched alkyl group having 1 to 10 carbon atoms, a linear or branched alkoxy group having 1 to 10 carbon atoms, or a linear, branched, or cyclic alkanesulfonyl group having 2 to 11 carbon atoms, $R^{18}$ represents a linear or branched alkyl group having 1 to 10 carbon atoms, a substituted or unsubstituted phenyl group, a substituted or unsubstituted naphthyl group, or a substituted or unsubstituted divalent group having 2 to 10 carbon atoms formed by $R^{18}$ and $R^{18}$ bonding to each other, k represents an integer from 0 to 2, r represents an integer from 0 to 10, and $X_-$ represents an anion shown by one of following formulas (5-1) to (5-4), $R^{18}$ and $R^{18}$ not forming a substituted or unsubstituted divalent group having 2 to 10 carbon atoms when X_ represents an anion shown by the following formula (5-1),

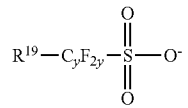 (5-1)

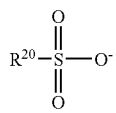 (5-2)

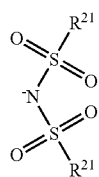 (5-3)

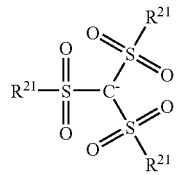 (5-4)

wherein $R^{19}$ represents a hydrogen atom, a fluorine atom, or a substituted or unsubstituted hydrocarbon group having 1 to 12 carbon atoms, y represents an integer from 1 to 10, $R^{20}$ represents a hydrocarbon group having 1 to 12 carbon atoms unsubstituted or substituted by an alkylcarbonyl group having 1 to 6 carbon atoms, an alkylcarbonyloxy group, or a hydroxyalkyl group, and $R^{21}$ represents a linear or branched fluoroalkyl group having 1 to 10 carbon atoms, or a substituted or unsubstituted divalent fluorine-containing group having 2 to 10 carbon atoms formed by $R^{21}$ and $R^{21}$ bonding to each other.

* * * * *